United States Patent
Schwindt et al.

(10) Patent No.: US 6,980,012 B2
(45) Date of Patent: *Dec. 27, 2005

(54) WAFER PROBE STATION FOR LOW-CURRENT MEASUREMENTS

(75) Inventors: Randy J. Schwindt, Portland, OR (US); Warren K. Harwood, Vancouver, WA (US); Paul A. Tervo, Vancouver, WA (US); Kenneth R. Smith, Portland, OR (US); Richard H. Warner, Portland, OR (US)

(73) Assignee: Cascase Microtech, Inc., Beaverton, OR (US)

( * ) Notice: Subject to any disclaimer, the term of this patent is extended or adjusted under 35 U.S.C. 154(b) by 199 days.
This patent is subject to a terminal disclaimer.

(21) Appl. No.: 10/678,549

(22) Filed: Oct. 2, 2003

(65) Prior Publication Data
US 2004/0061514 A1 Apr. 1, 2004

Related U.S. Application Data

(60) Continuation of application No. 10/274,086, filed on Oct. 18, 2002, now Pat. No. 6,740,036, which is a continuation of application No. 10/003,948, filed on Oct. 30, 2001, now Pat. No. 6,492,822, which is a continuation of application No. 09/784,231, filed on Feb. 13, 2001, now Pat. No. 6,335,628, which is a continuation of application No. 08/855,735, filed on May 9, 1997, now Pat. No. 6,232,788, which is a continuation of application No. 08/508,324, filed on Jul. 27, 1995, now Pat. No. 5,516,855, which is a continuation of application No. 08/100,494, filed on Aug. 2, 1993, now Pat. No. 5,457,398, which is a continuation-in-part of application No. 07/896,853, filed on Jun. 11, 1992, now Pat. No. 5,345,170, said application No. 08/508,324, is a continuation-in-part of application No. 08/417,982, filed on Apr. 6, 1995, now Pat. No. 5,532,609, which is a division of application No. 08/245,581, filed on May 18, 1994, now Pat. No. 5,434,512, which is a division of application No. 07/896,853.

(51) Int. Cl.$^7$ .......................... G01R 31/02; G01R 1/073
(52) U.S. Cl. ..................... 324/754; 324/158.1; 324/762
(58) Field of Search .............................. 324/73.1, 158.1, 324/754, 755, 758, 760, 761, 762, 765; 174/35 R

(56) References Cited

U.S. PATENT DOCUMENTS 3,333,274 A    7/1967  Forcier (Continued)

FOREIGN PATENT DOCUMENTS

EP           201205        12/1986

(Continued)

OTHER PUBLICATIONS

Micromanipulator Company, Inc., "Test Station Accessories." (month unavailable) (1983).

(Continued)

*Primary Examiner*—Ernest Karlsen
(74) *Attorney, Agent, or Firm*—Chernoff Vilhauer McClung & Stenzel LLP

(57) ABSTRACT

A probe station includes a fully guarded chuck assembly and connector mechanism for increasing sensitivity to low-level currents while reducing settling times. The chuck assembly includes a wafer-supporting first chuck element surrounded by a second chuck element having a lower component, skirting component and upper component each with a surface portion extending opposite the first element for guarding thereof. The connector mechanism is so connected to the second chuck element as to enable, during low-level current measurements, the potential on each component to follow that on the first chuck element as measured relative to an outer shielding enclosure surrounding each element. Leakage current from the first chuck element is thus reduced to virtually zero, hence enabling increased current sensitivity, and the reduced capacitance thus provided by the second chuck element decreases charging periods, hence reducing settling times. With similar operation and effect, where any signal line element of the connector mechanism is arranged exterior of its corresponding guard line element, such as adjacent the chuck assembly or on the probe-holding assembly, a guard enclosure is provided to surround and fully guard such signal line element in interposed relationship between that element and the outer shielding enclosure.

8 Claims, 12 Drawing Sheets

U.S. PATENT DOCUMENTS

| | | | |
|---|---|---|---|
| 3,710,251 | A | 1/1973 | Hagge et al. |
| 4,115,736 | A | 9/1978 | Tracy |
| 4,383,178 | A | 5/1983 | Shibata et al. |
| 4,532,423 | A | 7/1985 | Tojo et al. |
| 4,731,577 | A | 3/1988 | Logan |
| 4,755,746 | A | 7/1988 | Mallory et al. |
| 4,757,255 | A | 7/1988 | Margozzi |
| 4,758,785 | A | 7/1988 | Rath |
| 4,771,234 | A | 9/1988 | Cook et al. |
| 4,845,426 | A | 7/1989 | Nolan et al. |
| 4,856,904 | A | 8/1989 | Akagawa |
| 4,884,026 | A | 11/1989 | Hayakawa et al. |
| 5,077,523 | A | 12/1991 | Blanz |
| 5,084,671 | A | 1/1992 | Miyata et al. |
| 5,160,883 | A * | 11/1992 | Blanz .......................... 324/760 |
| 5,220,277 | A | 6/1993 | Reitinger |
| 5,345,170 | A | 9/1994 | Schwindt et al. |
| 5,434,512 | A | 7/1995 | Schwindt et al. |
| 5,457,398 | A | 10/1995 | Schwindt et al. |
| 5,532,609 | A | 7/1996 | Harwood et al. |
| 5,663,653 | A | 9/1997 | Schwindt et al. |
| 6,232,789 | B1 | 5/2001 | Schwindt |
| 6,335,628 | B2 | 1/2002 | Schwindt et al. |
| 6,492,822 | B2 | 12/2002 | Schwindt et al. |

FOREIGN PATENT DOCUMENTS

| | | |
|---|---|---|
| JP | 1-209380 | 8/1989 |
| JP | 2-220453 | 9/1990 |

OTHER PUBLICATIONS

Micromanipulator Company, Inc., "Model 8000 Test Station." (month unavailable) (1986).

"Model TPO3000 Series Thermochuck® Systems," four-page product note, Temptronic Corporation, Newton, MA (May 1992 or earlier).

"Application Note 1 Controlled Environment Enclosure," two-page application note, Temptronic Corporation, Newton, MA (May 1992 or earlier).

Micromanipulator Company, Inc. "Model 8000 Test Station." (month unavailable) (1988).

Applebay, Harry F. Deposition transcript (pp. 61–67) with exhibits 581 A.B.C. describing Flexion AP–1 probe station sold in 1987 (May 1988).

"Cross Section Signatone S–1240," one-page sketch prepared by Signatone counsel., Feb. 1988.

"S–1240," two-page product note, Signatone, San Jose, CA (Feb. 1988 or earlier per Signatone counsel).

Y. Yamamoto, "A Compact Self–Shielding Prober . . . " IEEE Trans., Inst. and Meas., vol. 38, pp. 1088–1093 (Dec. 1989).

Temptronic's "Guarded" Chuck, one-page note describing guarding system of Temptronic Corporation of Newton, MA, dated Nov. 15, 1989.

Beck & Tomann, "Chip Tester," IBM Technical Disclosure Bulletin, p. 4819 (Jan. 1985).

Article by William Knauer entitled "Fixturing for Low–Current/Low Voltage Parametric Testing," appearing in Evaluation Engineering, (Nov. 1990), pp. 150–153.

Hewlett–Packard, "Application Note 356–HP 4142B Modular DC Source/Monitor Practical Application," (Nov. 1987), pp. 1–4.

Hewlett–Packard, H–P Model 4284A Precision LCR Meter, Operation Manual (Dec. 1991) pp. 1–2, 6–9 and 6–15.

\* cited by examiner

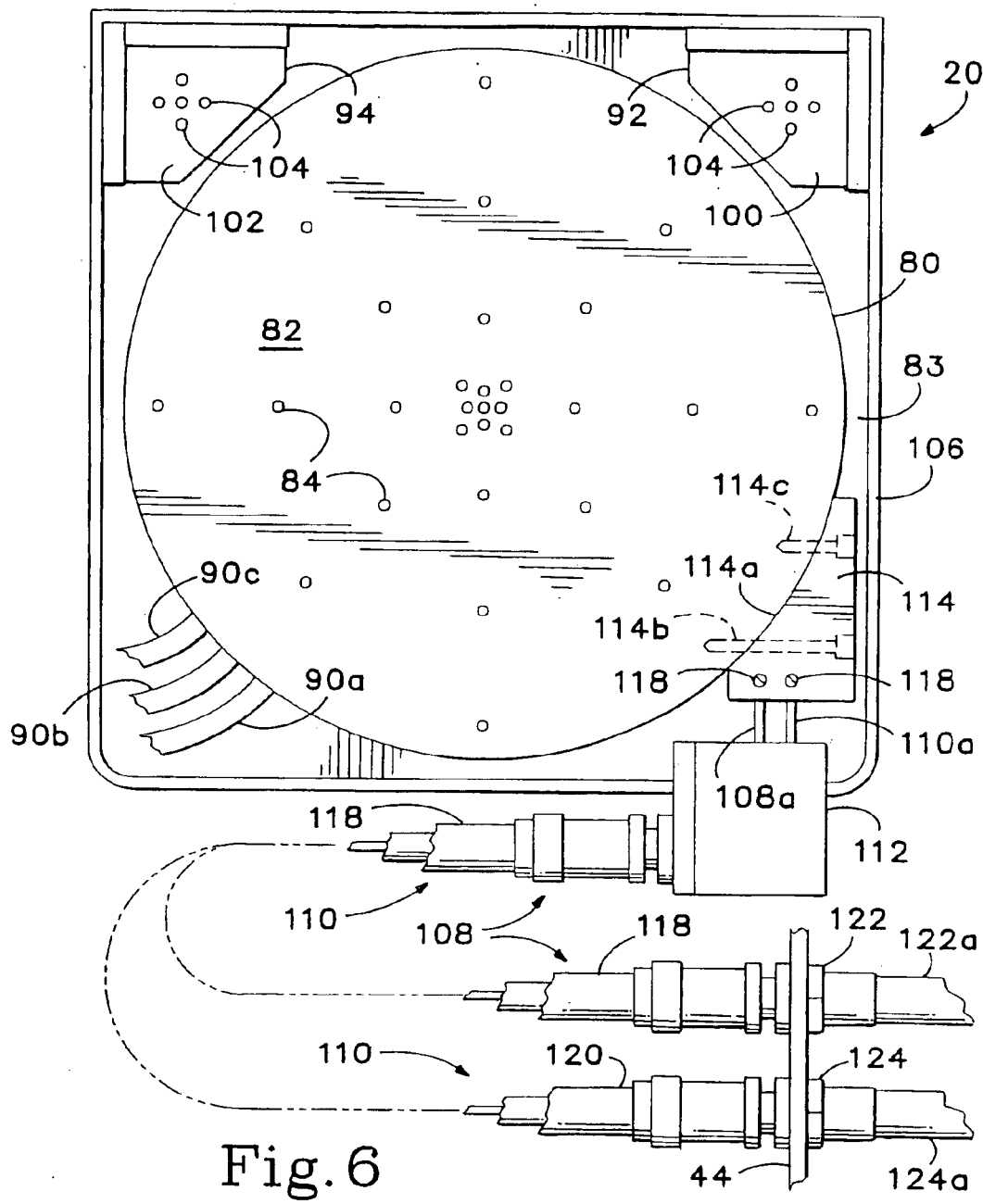
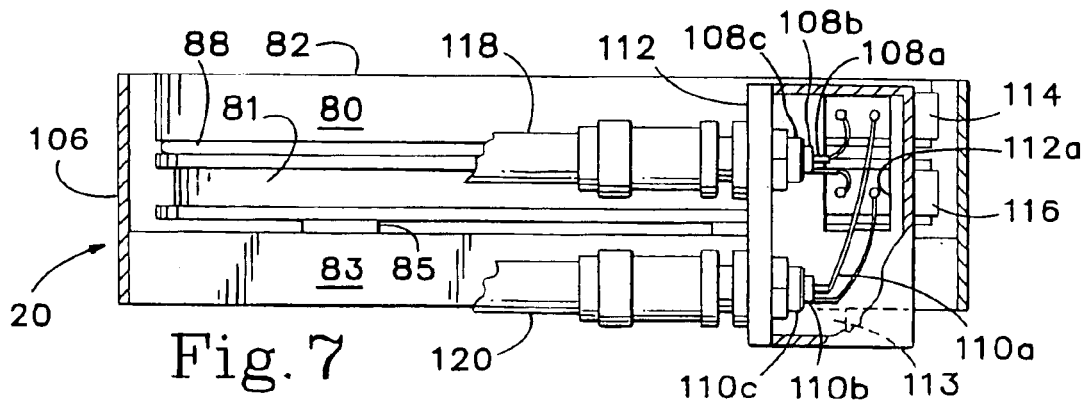
Fig. 6
Fig. 7

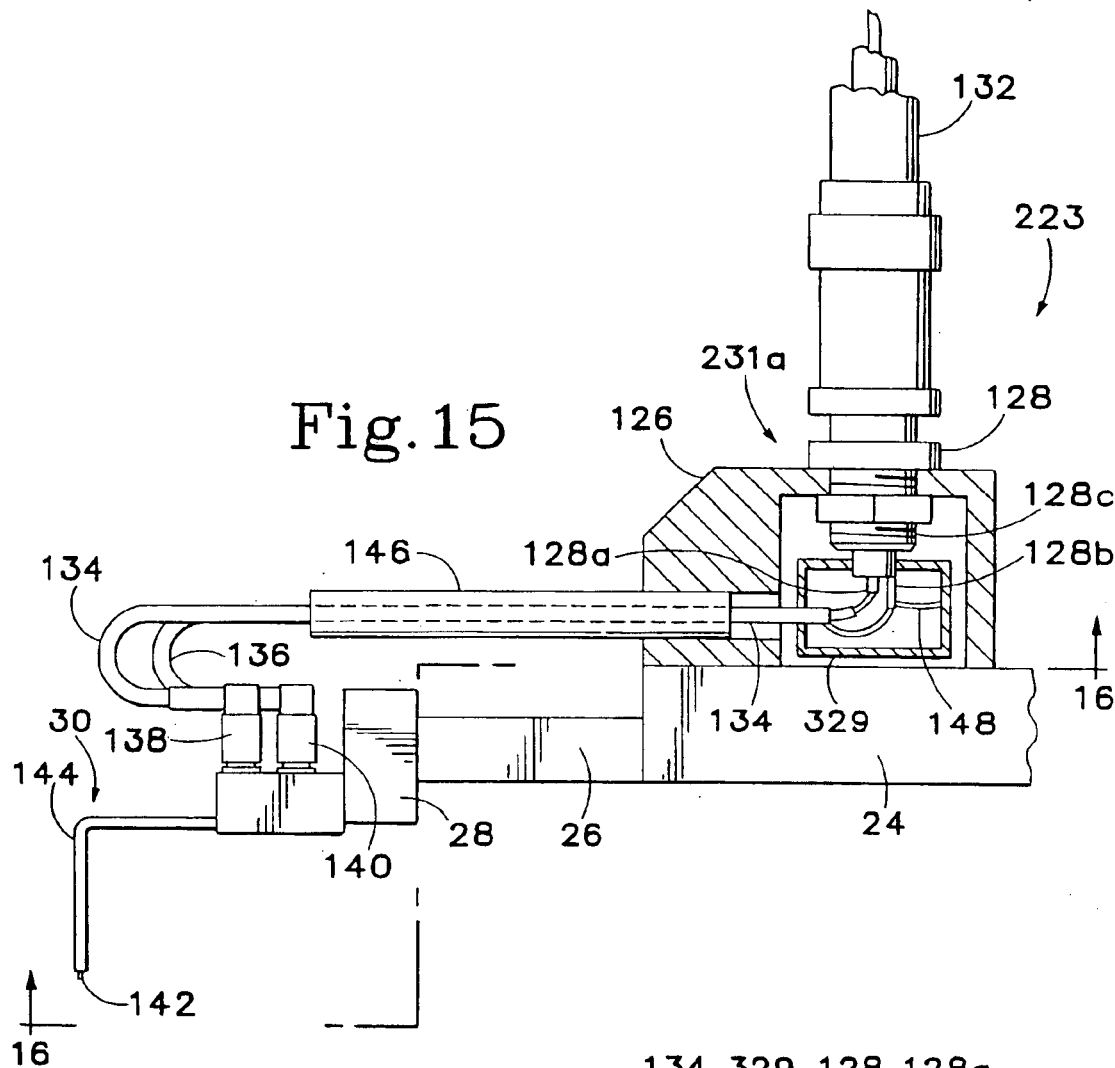
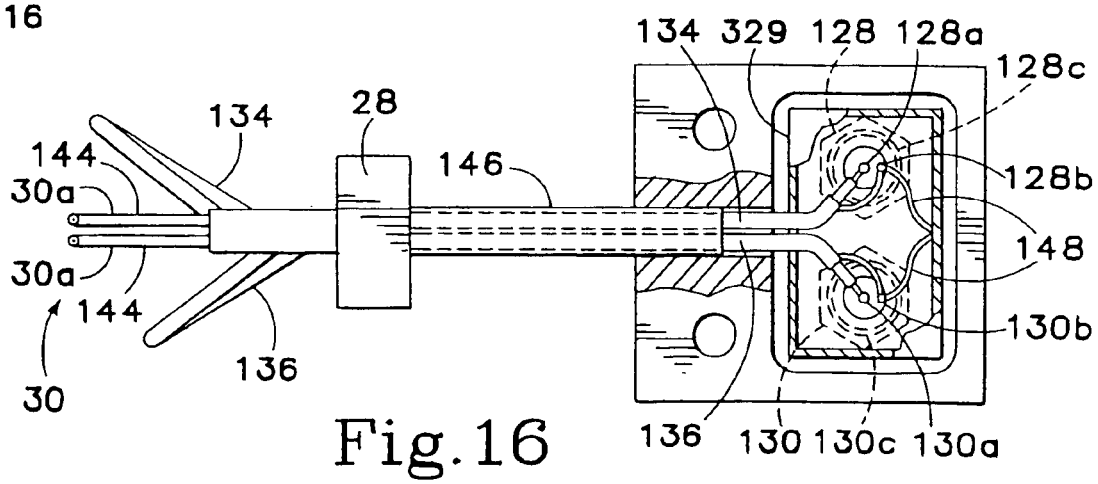

WAFER PROBE STATION FOR LOW-CURRENT MEASUREMENTS

This application is a continuation of U.S. patent application Ser. No. 10/274,086, filed Oct. 18, 2002, now U.S. Pat. No. 6,740,036 which is a continuation of U.S. patent application Ser. No. 10/003,948, filed Oct. 30, 2001, now U.S. Pat. No. 6,492,822, which is a continuation of U.S. patent application Ser. No. 09/784,231, filed Feb. 13, 2001, now U.S. Pat. No. 6,335,628, which is a continuation of U.S. patent application Ser. No. 08/855,735, filed May 9, 1997, now U.S. Pat. No. 6,232,788, which is a continuation of U.S. patent application Ser. No. 08/508,324 filed Jul. 27, 1995, now U.S. Pat. No. 5,516,855 which is a continuation of U.S. patent application Ser. No. 08/100,494, filed Aug. 2, 1993, now U.S. Pat. No. 5,457,398, which is a continuation in part of U.S. patent application Ser. No. 07/896,853 filed Jun. 11, 1992, now U.S. Pat. No. 5,345,170. U.S. patent application Ser. No. 08/508,325 filed on Jul. 27, 1995 is also a continuation in part of U.S. patent application Ser. No. 08/417,982 filed on Apr. 6, 1995, now U.S. Pat. No. 5,532,609 which, in turn, is a divisional of U.S. patent application Ser. No. 08/245,581 filed May 18, 1994, now U.S. Pat. No. 5,434,512, which is a divisional of U.S. patent application Ser. No. 07/896,853 filed on Jun. 11, 1992, now U.S. Pat. No. 5,345,170.

BACKGROUND OF THE INVENTION

The present invention is directed to probe stations adapted for making highly accurate low-current and low-voltage measurements of wafers and other electronic test devices. More particularly, the invention relates to such a probe station having a guarding system for preventing current leakage, a Kelvin connection system to eliminate voltage losses caused by line resistances, and an electromagnetic interference (EMI) shielding system.

The technique of guarding to minimize current leakage during low-current measurements, the use of Kelvin connections for low-voltage measurements, and the provision of EMI shielding are all well known and discussed extensively in the technical literature. See, for example, an article by William Knauer entitled "Fixturing for Low-Current/Low-Voltage Parametric Testing," appearing in *Evaluation Engineering*, November, 1990, pages 150–153. See also Hewlett-Packard, "Application Note 356-HP 4142B Modular DC Source/Monitor Practical Application," (1987) pages 1–4, and Hewlett-Packard, *H-P Model 4284A Precision LCR Meter, Operation Manual* (1991) pages 2–1, 6–9, and 6–15.

In guarding applications, a conductor surrounding or otherwise closely adjacent to a low-current line or circuit is maintained at the same potential as the line or circuit to reduce leakage currents therefrom, so that low-current measurements can be made accurately.

Kelvin connections compensate for voltage losses caused by line resistances which would otherwise cause errors in low-voltage measurements. This is accomplished by providing a source line and a measurement line (also referred to commonly as "force" and "sense" lines, respectively) to an interconnection point (the Kelvin connection) which is as close to the test device as possible. A high-impedance voltmeter is connected to this interconnection point through the measurement line to accurately detect the voltage without any significant flow of current or resultant voltage drop in the measurement line. This avoids the error which would otherwise occur if the voltmeter were to detect the voltage through the source line, due to the voltage drop that occurs in the source line.

Probe stations have previously been used for conducting tests with guarding, Kelvin connection, and EMI shielding techniques. However the custom set-up of such probe stations required for guarding and Kelvin connection procedures is time-consuming and, in some instances, limited as to effectiveness. For example, in an article by Yousuke Yamamoto, entitled "A Compact Self-Shielding Prober for Accurate Measurement of On-Wafer Electron Devices," appearing in *IEEE Transactions on Instrumentation and Measurement*, Volume 38, No. 6, December, 1989, pages 1088–1093, a probe station is shown having a respective detachable triaxial connector mounted on the probe card and the chuck assembly which supports the test device. The intermediate connector element of a triaxial connector normally is utilized for guarding purposes. However the chuck assembly shown has only a chuck and a shield, with no separate guarding structure to which the intermediate connector element could be connected. Accordingly significant time-consuming alteration of such a station would be required to obtain both a guarded and shielded chuck assembly. The probes on the probe card, on the other hand, are both guarded and shielded; however there is no means of enabling each probe to be moved independently of the others in unison with its guard and shield to accommodate different contact patterns of test devices, thus sacrificing flexibility of the probe station. Also, there is no provision for Kelvin connections on the chuck assembly, which would require more than a single triaxial connector as shown.

Chuck assemblies are available which provide guarding and shielding components. For example, Temptronic Corporation of Newton, Mass. markets a thermal chuck assembly atop which is mounted an "add-on" supporting surface for the test device, with a copper guarding layer interposed between the add-on surface and the underlying chuck assembly and insulated from each by respective sheets of insulating material. This structure permits a signal line to be soldered to the add-on surface, a guard line to be soldered to the copper guarding layer, and a ground line to be soldered to the underlying chuck assembly which can then serve as a shield. However such wiring requires time-consuming set-up, particularly if Kelvin connections are also required. Moreover, the use of sheet insulation to insulate the copper guarding layer from the add-on surface and the underlying chuck assembly fails to provide as low a dielectric constant between the respective elements as is desirable to minimize leakage currents in view of the low level of current to be measured.

With respect to probe stations that are designed to accommodate the measurement of low levels of current, a sensitivity threshold is normally encountered below which further improvements in current sensitivity are difficult to reliably achieve. In most commercial probe stations that are of such design, this sensitivity threshold is typically reached at about 20–50 femtoamps. However, improvements in device fabrication and in the capabilities of commercially available test instrumentation make it desirable to reduce the sensitivity threshold to a level reliably within the single digit femtoamp range.

A particular difficulty encountered in low-level current measurements is the excessive time required for measurement voltages to stabilize with reference to the device under test after a shift in voltage has occurred at the electrical input to the probe station. This problem of excessive settling time, as it is referred to, increases as the level of current under measurement is reduced. That is, due to the residual capacitance existing between spaced apart conductors in the region surrounding the immediate test site, a certain amount of time is required for the conductors that are in direct connection with the test device to fully charge or discharge to their desired voltages, and the time required will increase as the current through the device decreases. If the residual capacitance and the degree of input voltage shift are moderately large and if the level of current being measured is moderately small, the probe station operator can encounter settling times that are upwards of two or three minutes. Clearly, then, it is desirable that settling times be generally reduced in order to reduce overall measurement time, particularly where the device under test is a wafer containing large numbers of discrete devices, each of which may individually require low-level current testing.

In addition to settling effects, measurements of low level currents are also susceptible to error due to electrical discharge effects which occur because of the acceptance and release of charge by nonconductors in the region surrounding the immediate test site. At very low currents, these discharge effects can significantly distort measurement values and hence contribute to unacceptable levels of measurement instability.

SUMMARY OF THE INVENTION

The present invention solves the foregoing drawbacks of the prior probe stations by providing a probe station having integrated and ready-to-use guarding, Kelvin connection and shielding systems, both for individually movable probes and for the chuck assembly.

In further preferred embodiments of the invention, an improved guarding system is provided for accurate and rapid measurement of very low-level currents.

The chuck assembly of the present invention may in preferred embodiments thereof comprise at least first, second and third chuck assembly elements electrically insulated from one another and positioned at progressively greater distances from the probe(s) along the axis of approach between them. At least one detachable electrical connector assembly is provided on the chuck assembly having respective connector elements connected matingly to the first and second chuck assembly elements, respectively, so as to provide a ready-to-use guarding system requiring only the easy detachable connection of a guarded cable to the connector assembly for immediate operability.

Preferably, a second such detachable electrical connector assembly is also provided having its corresponding connector elements connected, in parallel with those of the first connector assembly, to the first and second chuck assembly elements so as to provide a ready-to-use guarded Kelvin connection on the chuck assembly which becomes immediately operable by the easy detachable connection of a second guarded cable to the second connector assembly. Thus one cable serves as a guarded source line and the other serves as a guarded measurement line.

Leakage currents in the chuck assembly are preferably minimized by the fact that the three chuck assembly elements are electrically insulated from one another by distributed patterns of dielectric spacers, rather than continuous dielectric sheets, so that large air gaps are provided between the respective chuck assembly elements to reduce the dielectric constant in the gaps between the elements.

In further preferred embodiments of the present invention, the second chuck assembly element is provided with respective upper, lower and skirting components to provide full guarding for the first chuck assembly element. In particular, respective surface portions on the upper, lower and skirting components extend opposite the upper, lower and peripheral surfaces, respectively, of the first chuck assembly element. Furthermore, a connector mechanism is provided that enables a nonzero potential to be established on the first chuck assembly element relative to ground, that is, relative to the outer shielding enclosure, and a substantially equal potential to be established on the second chuck assembly element.

In accordance, then, with a preferred method of use, the exemplary chuck assembly structure just described is energized via the connector mechanism so that the potential on the first element is effectively matched by a substantially equal potential on the second element whereby virtually no potential difference is developed in the region between the elements. As a result of this relationship and the arrangement of components of the second chuck assembly element, leakage current from the first chuck assembly element is reduced to virtually zero which enables low-level currents to be measured with increased sensitivity. Furthermore, with respect to low-level current measurements, settling times during startup and switchover phases of operation are reduced. That is, the second chuck assembly element, unlike the first, acquires or releases charge at a rate not limited by the large effective resistance presented by the device under test. Accordingly, the respective guarding components are able to achieve their full potential relatively quickly even though they are directly coupled capacitively to conductive surfaces of large area such as those on the outer shielding enclosure. The respective guarding components also serve as an effective barrier to stray radiation to the extent they are interposed between the element emitting such radiation and the first chuck assembly element. Therefore, relative even to the low levels of current being measured, the potential error or instability in each measurement is reduced to an insignificant level.

Individually movable probe holders are provided having not only ready-to-use guarded signal line cables and Kelvin connection cables, but also respective shields for the cables of each probe, the shields being movable independently in unison with each probe separately.

Where a line element of the connector mechanism that carries the signal is arranged exterior of its corresponding guard element, such as where it is separated out from the guard element for interconnection with another signal element, preferably a conductive guard enclosure is provided which surrounds the signal line element in interposed relationship between such element and the outer shielding enclosure. Furthermore, when a nonzero potential is established during low-level current measurement on the signal line element relative to ground, that is, relative to the outer shielding enclosure, preferably the connector mechanism is so connected to the guard enclosure as to enable a substantially equal potential to be established on the guard enclosure.

The signal line guarding system just described can thus be energized via the connector mechanism so that virtually no potential difference is developed between the signal line element and its surrounding guard enclosure. Hence, the level of leakage current flowing away from the signal line element is reduced to virtually zero which enables low-level currents in the system to be measured with increased sensitivity. Also, since there is a reduction in the combined area of the conductive surfaces to which the signal line element is capacitively coupled, less energy transfer and time is required for this line element to acquire its full potential, so that settling time is reduced. Moreover, if any transient shifts in electrical state should occur in relation to any nonconductor or conductor located outside the guard enclosure, this will have virtually no effect on the signal line element due to the effective barrier against radiation provided by the conductive guard enclosure, so that measurement instability is reduced.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 2A is a partial top view of the wafer probe station of FIG. 1 with the enclosure door shown partially open.

FIG. 3A is an enlarged sectional view taken along line 3A—3A of FIG. 3.

FIG. 6 is a partially schematic top detail view of the chuck assembly, taken along line 6—6 of FIG. 3.

FIG. 7 is a partially sectional front view of the chuck assembly of FIG. 6.

FIG. 15 is a partially sectional side view of an alternative exemplary probe holder which is suitable for use in association with the wafer probe station of FIG. 10.

FIG. 16 is a partially sectional bottom view taken along line 16—16 of FIG. 15 with hidden portions shown in cut-away view.

DESCRIPTION OF THE PREFERRED EMBODIMENTS

General Arrangement of Probe Station

Figure 1:
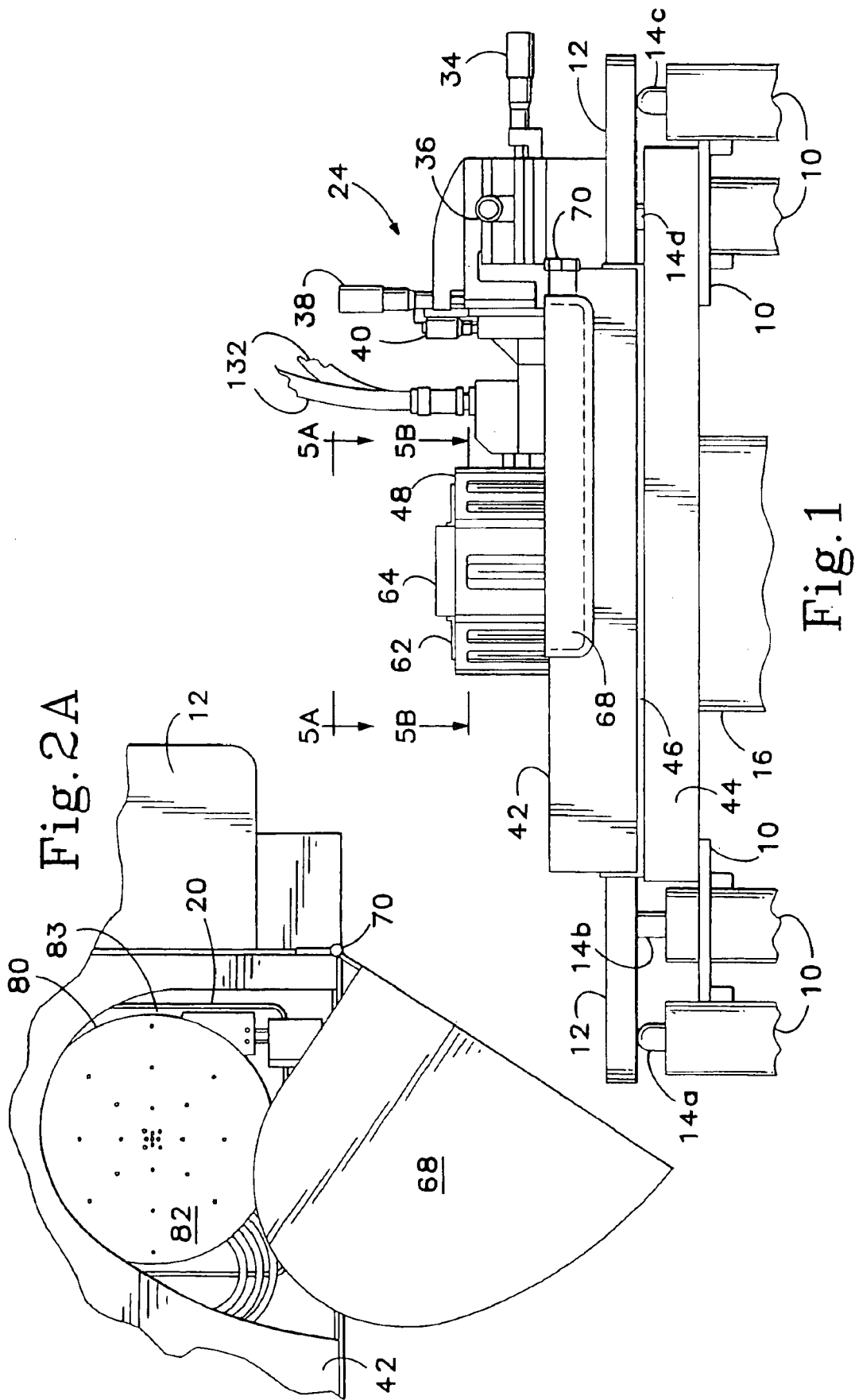
FIG. 1 is a partial front view of an exemplary embodiment of a wafer probe station constructed in accordance with the present invention.
Figure 2:
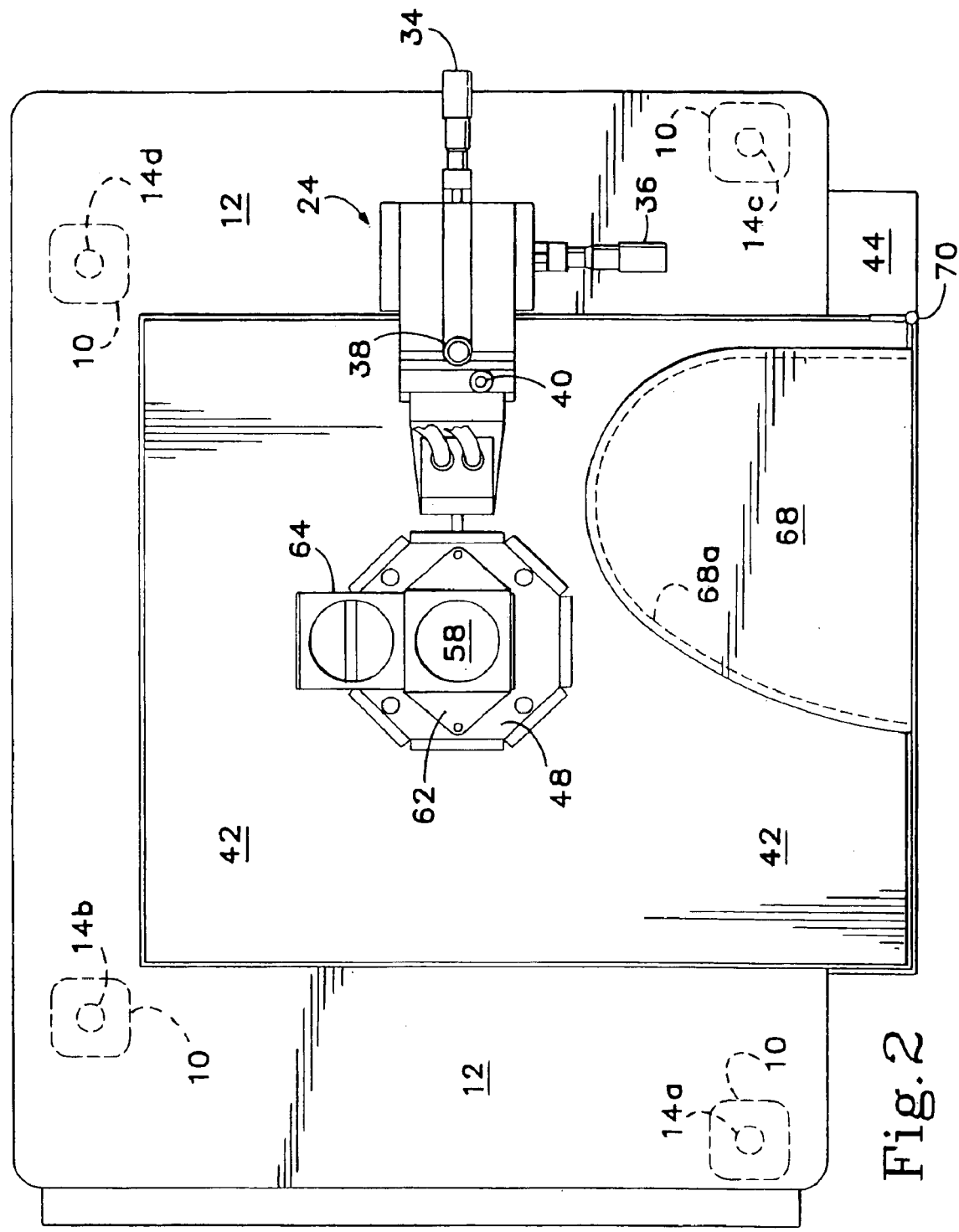
FIG. 2 is a top view of the wafer probe station of FIG. 1.
Figure 3:
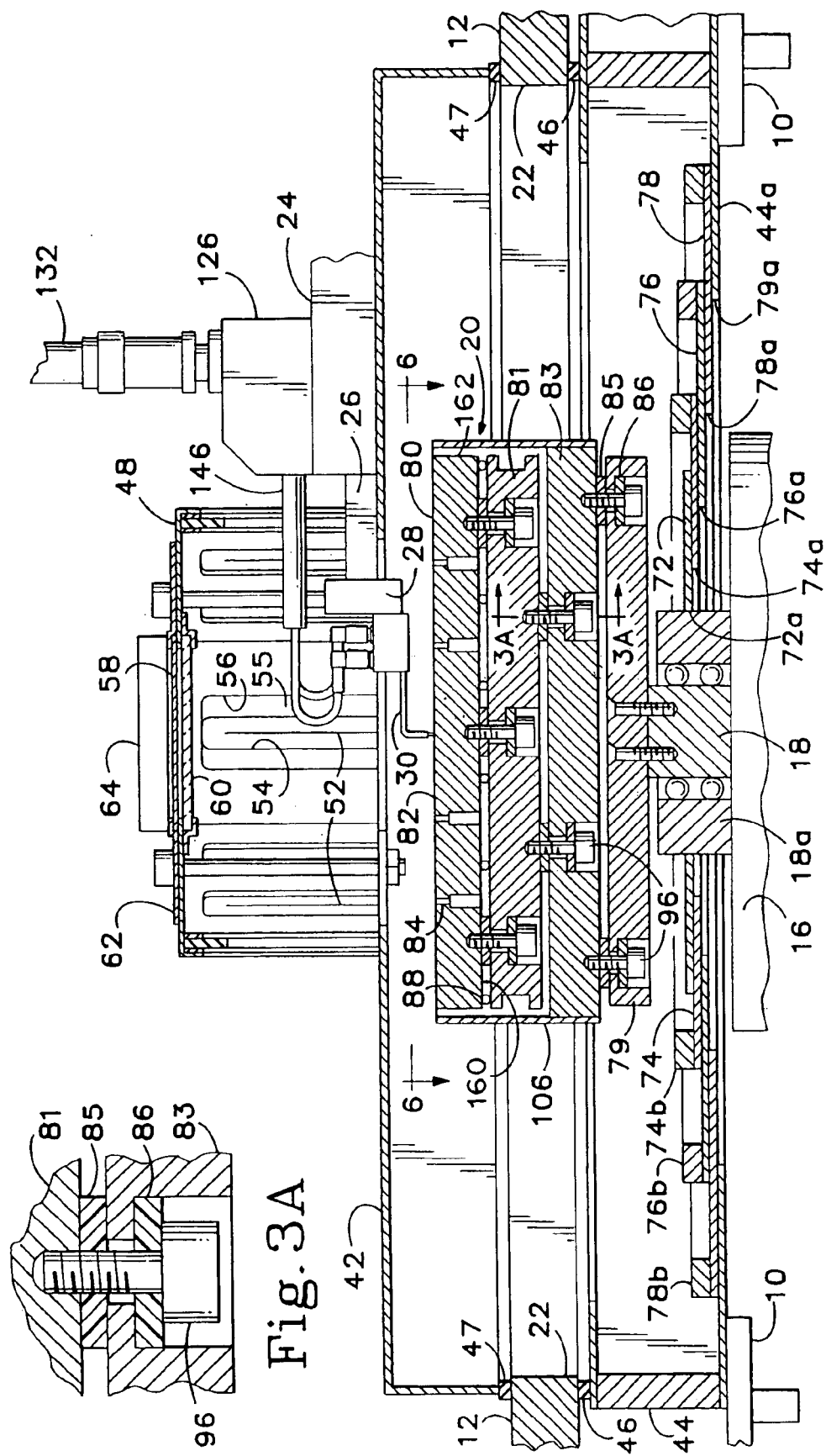
FIG. 3 is a partially sectional and partially schematic front view of the probe station of FIG. 1.

With reference to FIGS. 1, 2 and 3, an exemplary embodiment of the probe station of the present invention comprises a base 10 (shown partially) which supports a platen 12 through a number of jacks 14a, 14b, 14c, 14d which selectively raise and lower the platen vertically relative to the base by a small increment (approximately one-tenth of an inch) for purposes to be described hereafter. Also supported by the base 10 of the probe station is a motorized positioner 16 having a rectangular plunger 18 which supports a movable chuck assembly 20 for supporting a wafer or other test device. The chuck assembly 20 passes freely through a large aperture 22 in the platen 12 which permits the chuck assembly to be moved independently of the platen by the positioner 16 along X, Y and Z axes, i.e. horizontally along two mutually-perpendicular axes X and Y, and vertically along the Z axis. Likewise, the platen 12, when moved vertically by the jacks 14, moves independently of the chuck assembly 20 and the positioner 16.

Mounted atop the platen 12 are multiple individual probe positioners such as 24 (only one of which is shown), each having an extending member 26 to which is mounted a probe holder 28 which in turn supports a respective probe 30 for contacting wafers and other test devices mounted atop the chuck assembly 20. The probe positioner 24 has micrometer adjustments 34, 36 and 38 for adjusting the position of the probe holder 28, and thus the probe 30, along the X, Y and Z axes respectively, relative to the chuck assembly 20. The Z axis is exemplary of what is referred to herein loosely as the "axis of approach" between the probe holder 28 and the chuck assembly 20, although directions of approach which are neither vertical nor linear, along which the probe tip and wafer or other test device are brought into contact with each other, are also intended to be included within the meaning of the term "axis of approach." A further micrometer adjustment 40 adjustably tilts the probe holder 28 to adjust planarity of the probe with respect to the wafer or other test device supported by the chuck assembly 20. As many as twelve individual probe positioners 24, each supporting a respective probe, may be arranged on the platen 12 around the chuck assembly 20 so as to converge radially toward the chuck assembly similarly to the spokes of a wheel. With such an arrangement, each individual positioner 24 can independently adjust its respective probe in the X, Y and Z directions, while the jacks 14 can be actuated to raise or lower the platen 12 and thus all of the positioners 24 and their respective probes in unison.

An environment control outer enclosure is composed of an upper box portion 42 rigidly attached to the platen 12, and a lower box portion 44 rigidly attached to the base 10. Both portions are made of steel or other suitable electrically conductive material to provide EMI shielding. To accommodate the small vertical movement between the two box portions 42 and 44 when the jacks 14 are actuated to raise or lower the platen 12, an electrically conductive resilient foam gasket 46, preferably composed of silver or carbon-impregnated silicone, is interposed peripherally at their mating juncture at the front of the enclosure and between the lower portion 44 and the platen 12 so that an EMI, substantially hermetic, and light seal are all maintained despite relative vertical movement between the two box portions 42 and 44. Even though the upper box portion 42 is rigidly attached to the platen 12, a similar gasket 47 is preferably interposed between the portion 42 and the top of the platen to maximize sealing.

Figure 5A:
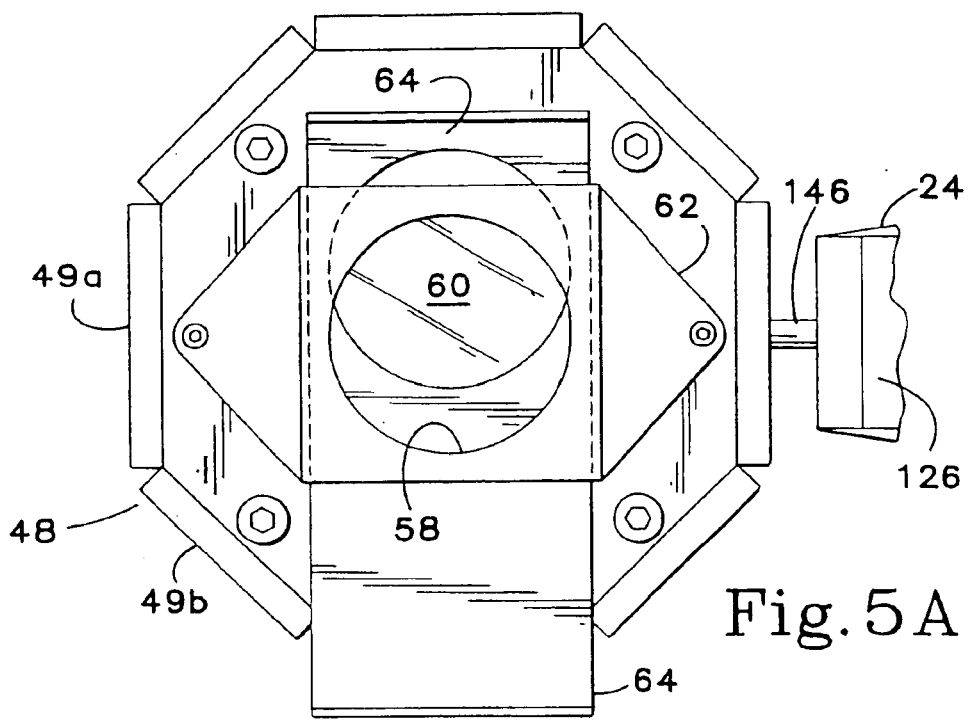
FIG. 5A is an enlarged top detail view taken along line 5A—5A of FIG. 1.
Figure 5B:
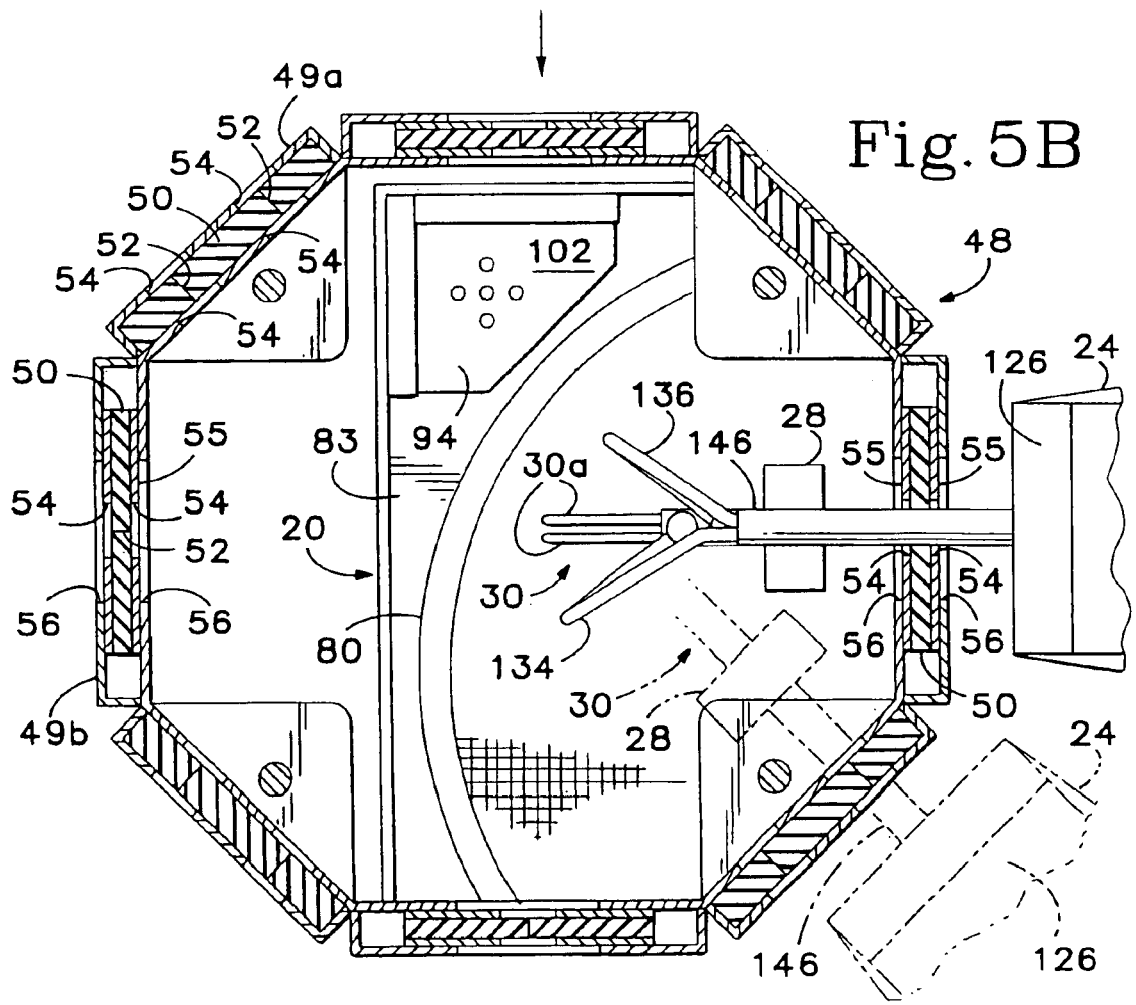
FIG. 5B is an enlarged top sectional view taken along line 5B—5B of FIG. 1.

With reference to FIGS. 5A and 5B, the top of the upper box portion 42 comprises an octagonal steel box 48 having eight side panels such as 49a and 49b through which the extending members 26 of the respective probe positioners 24 can penetrate movably. Each panel comprises a hollow housing in which a respective sheet 50 of resilient foam, which may be similar to the above-identified gasket material, is placed. Slits such as 52 are partially cut vertically in the foam in alignment with slots 54 formed in the inner and outer surfaces of each panel housing, through which a respective extending member 26 of a respective probe positioner 24 can pass movably. The slitted foam permits X, Y and Z movement of the extending members 26 of each probe positioner, while maintaining the EMI, substantially hermetic, and light seal provided by the enclosure. In four of the panels, to enable a greater range of X and Y movement, the foam sheet 50 is sandwiched between a pair of steel plates 55 having slots 54 therein, such plates being slidable transversely within the panel housing through a range of movement encompassed by larger slots 56 in the inner and outer surfaces of the panel housing.

Atop the octagonal box 48, a circular viewing aperture 58 is provided, having a recessed circular transparent sealing window 60 therein. A bracket 62 holds an apertured sliding shutter 64 to selectively permit or prevent the passage of light through the window. A stereoscope (not shown) connected to a CRT monitor can be placed above the window to provide a magnified display of the wafer or other test device and the probe tip for proper probe placement during set-up or operation. Alternatively, the window 60 can be removed and a microscope lens (not shown) surrounded by a foam gasket can be inserted through the viewing aperture 58 with the foam providing EMI, hermetic and light sealing.

The upper box portion 42 of the environment control enclosure also includes a hinged steel door 68 which pivots outwardly about the pivot axis of a hinge 70 as shown in FIG. 2A. The hinge biases the door downwardly toward the top of the upper box portion 42 so that it forms a tight, overlapping, sliding peripheral seal 68a with the top of the upper box portion. When the door is open, and the chuck assembly 20 is moved by the positioner 16 beneath the door opening as shown in FIG. 2A, the chuck assembly is accessible for loading and unloading.

Figure 4:
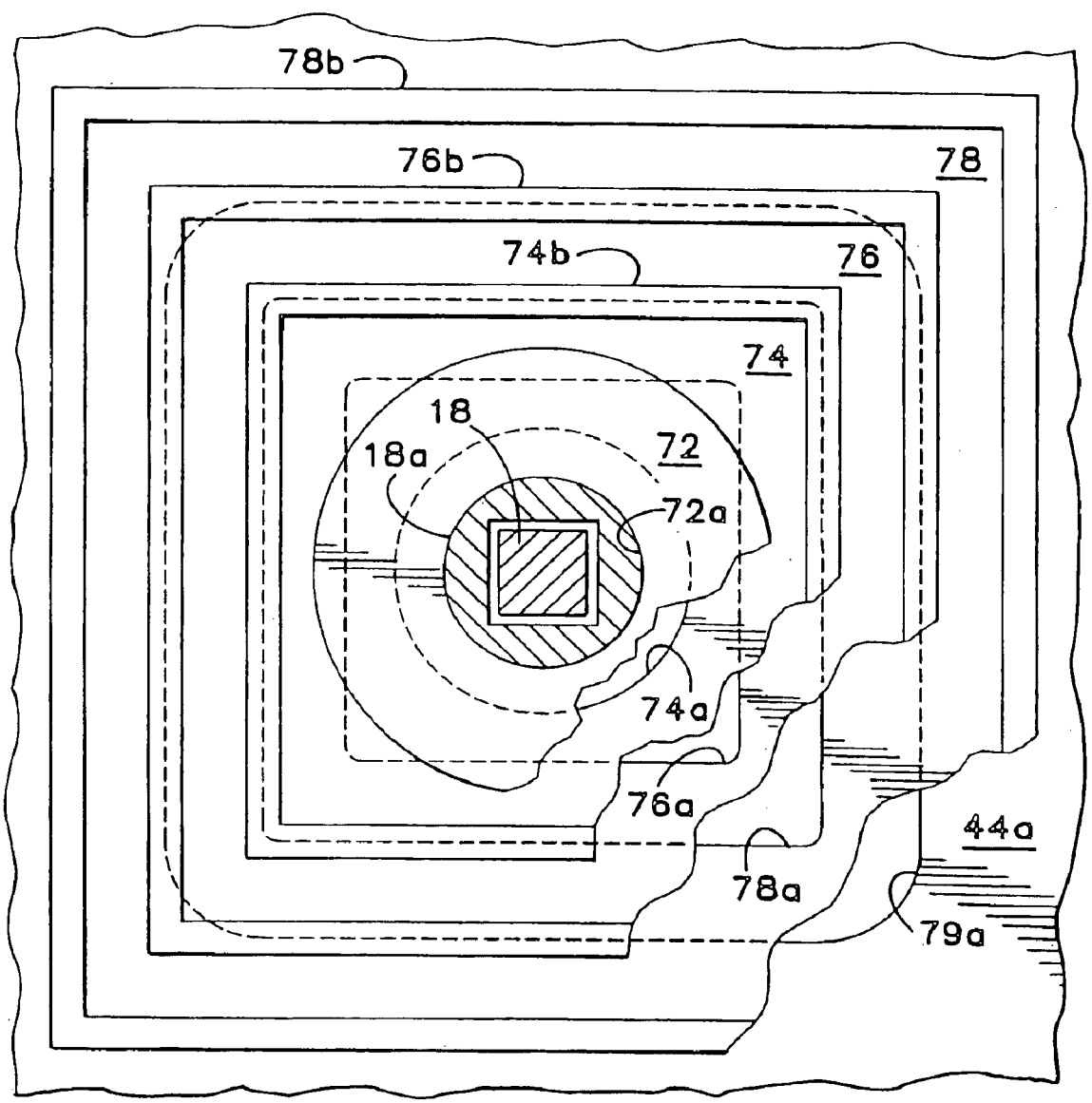
FIG. 4 is a top view of the sealing assembly where the motorized positioning mechanism extends through the bottom of the enclosure.

With reference to FIGS. 3 and 4, the sealing integrity of the enclosure is likewise maintained throughout positioning movements by the motorized positioner 16 due to the provision of a series of four sealing plates 72, 74, 76 and 78 stacked slidably atop one another. The sizes of the plates progress increasingly from the top to the bottom one, as do the respective sizes of the central apertures 72a, 74a, 76a and 78a formed in the respective plates 72, 74, 76 and 78, and the aperture 79a formed in the bottom 44a of the lower box portion 44. The central aperture 72a in the top plate 72 mates closely around the bearing housing 18a of the vertically-movable plunger 18. The next plate in the downward progression, plate 74, has an upwardly-projecting peripheral margin 74b which limits the extent to which the plate 72 can slide across the top of the plate 74. The central aperture 74a in the plate 74 is of a size to permit the positioner 16 to move the plunger 18 and its bearing housing 18a transversely along the X and Y axes until the edge of the top plate 72 abuts against the margin 74b of the plate 74. The size of the aperture 74a is, however, too small to be uncovered by the top plate 72 when such abutment occurs, and therefore a seal is maintained between the plates 72 and 74 regardless of the movement of the plunger 18 and its bearing housing along the X and Y axes. Further movement of the plunger 18 and bearing housing in the direction of abutment of the plate 72 with the margin 74b results in the sliding of the plate 74 toward the peripheral margin 76b of the next underlying plate 76. Again, the central aperture 76a in the plate 76 is large enough to permit abutment of the plate 74 with the margin 76b, but small enough to prevent the plate 74 from uncovering the aperture 76a, thereby likewise maintaining the seal between the plates 74 and 76. Still further movement of the plunger 18 and bearing housing in the same direction causes similar sliding of the plates 76 and 78 relative to their underlying plates into abutment with the margin 78b and the side of the box portion 44, respectively, without the apertures 78a and 79a becoming uncovered. This combination of sliding plates and central apertures of progressively increasing size permits a full range of movement of the plunger 18 along the X and Y axes by the positioner 16, while maintaining the enclosure in a sealed condition despite such positioning movement. The EMI sealing provided by this structure is effective even with respect to the electric motors of the positioner 16, since they are located below the sliding plates.

Chuck Assembly

With particular reference to FIGS. 3, 6 and 7, the chuck assembly 20 is of a unique modular construction usable either with or without an environment control enclosure. The plunger 18 supports an adjustment plate 79 which in turn supports first, second and third chuck assembly elements 80, 81 and 83, respectively, positioned at progressively greater distances from the probe(s) along the axis of approach. The lower chuck assembly element 83 is a conductive rectangular stage or shield 83 which detachably mounts conductive elements 80 and 81 of circular shape. In addition to having a lower surface 160 and a peripheral surface 162, the upper chuck assembly element 80 has a planar upwardly-facing wafer-supporting or upper surface 82 having an array of vertical apertures 84 therein. These apertures communicate with respective chambers separated by O-rings 88, the chambers in turn being connected separately to different vacuum lines 90a, 90b, 90c (FIG. 6) communicating through separately-controlled vacuum valves (not shown) with a source of vacuum. The respective vacuum lines selectively connect the respective chambers and their apertures to the source of vacuum to hold the wafer, or alternatively isolate the apertures from the source of vacuum to release the wafer, in a conventional manner. The separate operability of the respective chambers and their corresponding apertures enables the chuck to hold wafers of different diameters.

In addition to the circular elements 80 and 81, auxiliary chucks such as 92 and 94 are detachably mounted on the corners of the element 83 by screws (not shown) independently of the elements 80 and 81 for the purpose of supporting contact substrates and calibration substrates while a wafer or other test device is simultaneously supported by the element 80. Each auxiliary chuck 92, 94 has its own separate upwardly-facing planar surface 100, 102 respectively, in parallel relationship to the surface 82 of the element 80. Vacuum apertures 104 protrude through the surfaces 100 and 102 from communication with respective chambers within the body of each auxiliary chuck. Each of these chambers in turn communicates through a separate vacuum line and a separate independently-actuated vacuum valve (not shown) with a source of vacuum, each such valve selectively connecting or isolating the respective sets of apertures 104 with respect to the source of vacuum independently of the operation of the apertures 84 of the element 80, so as to selectively hold or release a contact substrate or calibration substrate located on the respective surfaces 100 and 102 independently of the wafer or other test device. An optional metal shield 106 may protrude upwardly from the edges of the element 83 to surround or skirt the other elements 80, 81 and the auxiliary chucks 92, 94.

All of the chuck assembly elements 80, 81 and 83, as well as the additional chuck assembly element 79, are electrically insulated from one another even though they are constructed of electrically conductive metal and interconnected detachably by metallic screws such as 96. With reference to FIGS. 3 and 3A, the electrical insulation results from the fact that, in addition to the resilient dielectric O-rings 88, dielectric spacers 85 and dielectric washers 86 are provided. These, coupled with the fact that the screws 96 pass through oversized apertures in the lower one of the two elements which each screw joins together thereby preventing electrical contact between the shank of the screw and the lower element, provide the desired insulation. As is apparent in FIG. 3, the dielectric spacers 85 extend over only minor portions of the opposing surface areas of the interconnected chuck assembly elements, thereby leaving air gaps between the opposing surfaces over major portions of their respective areas. Such air gaps minimize the dielectric constant in the spaces between the respective chuck assembly elements, thereby correspondingly minimizing the capacitance between them and the ability for electrical current to leak from one element to another. Preferably the spacers and washers 85 and 86, respectively, are constructed of a material having the lowest possible dielectric constant consistent with high dimensional stability and high volume resistivity. A suitable material for the spacers and washers is glass epoxy, or acetal homopolymer marketed under the trademark Delrin by E. I. DuPont.

With reference to FIGS. 6 and 7, the chuck assembly 20 also includes a pair of detachable electrical connector assemblies designated generally as 108 and 110, each having at least two conductive connector elements 108a, 108b and 110a, 110b, respectively, electrically insulated from each other, with the connector elements 108b and 110b preferably coaxially surrounding the connector elements 108a and 110a as guards therefor. If desired, the connector assemblies 108 and 110 can be triaxial in configuration so as to include respective outer shields 108c, 110c surrounding the respective connector elements 108b and 110b, as shown in FIG. 7. The outer shields 108c and 110c may, if desired, be connected electrically through a shielding box 112 and a connector supporting bracket 113 to the chuck assembly element 83, although such electrical connection is optional particularly in view of the surrounding EMI shielding enclosure 42, 44. In any case, the respective connector elements 108a and 110a are electrically connected in parallel to a connector plate 114 matingly and detachably connected along a curved contact surface 114a by screws 114b and 114c to the curved edge of the chuck assembly element 80. Conversely, the connector elements 108b and 110b are connected in parallel to a connector plate 116 similarly matingly connected detachably to element 81. The connector elements pass freely through a rectangular opening 112a in the box 112, being electrically insulated from the box 112 and therefore from the element 83, as well as being electrically insulated from each other. Set screws such as 118 detachably fasten the connector elements to the respective connector plates 114 and 116.

Either coaxial or, as shown, triaxial cables 118 and 120 form portions of the respective detachable electrical connector assemblies 108 and 110, as do their respective triaxial detachable connectors 122 and 124 which penetrate a wall of the lower portion 44 of the environment control enclosure so that the outer shields of the triaxial connectors 122, 124 are electrically connected to the enclosure. Further triaxial cables 122a, 124a are detachably connectable to the connectors 122 and 124 from suitable test equipment such as a Hewlett-Packard 4142B modular DC source/monitor or a Hewlett-Packard 4284A precision LCR meter, depending upon the test application. If the cables 118 and 120 are merely coaxial cables or other types of cables having only two conductors, one conductor interconnects the inner (signal) connector element of a respective connector 122 or 124 with a respective connector element 108a or 110a, while the other conductor connects the intermediate (guard) connector element of a respective connector 122 or 124 with a respective connector element 108b, 110b.

In any case, the detachable connector assemblies 108, 110, due to their interconnections with the two connector plates 114, 116, provide immediately ready-to-use signal and guard connections to the chuck assembly elements 80 and 81, respectively, as well as ready-to-use guarded Kelvin connections thereto. For applications requiring only guarding of the chuck assembly, as for example the measurement of low-current leakage from a test device through the element 80, it is necessary only that the operator connect a single guarded cable 122a from a test instrument such as a Hewlett-Packard 4142B modular DC source/monitor to the detachable connector 122 so that a signal line is provided to the chuck assembly element 80 through the connector element 108a and connector plate 114, and a guard line is provided to the element 81 through the connector element 108b and connector plate 116. Alternatively, if a Kelvin connection to the chuck assembly is desired for low-voltage measurements, such as those needed for measurements of low capacitance, the operator need merely attach a pair of cables 122a and 124a to the respective connectors 122, 124 from a suitable test instrument such as a Hewlett-Packard 4284A precision LCR meter, thereby providing both source and measurement lines to the element 80 through the connector elements 108a and 110a and connector plate 114, and guarding lines to the element 81 through the connector elements 108b and 110b and connector plate 116.

Probe Assembly

Figure 8:
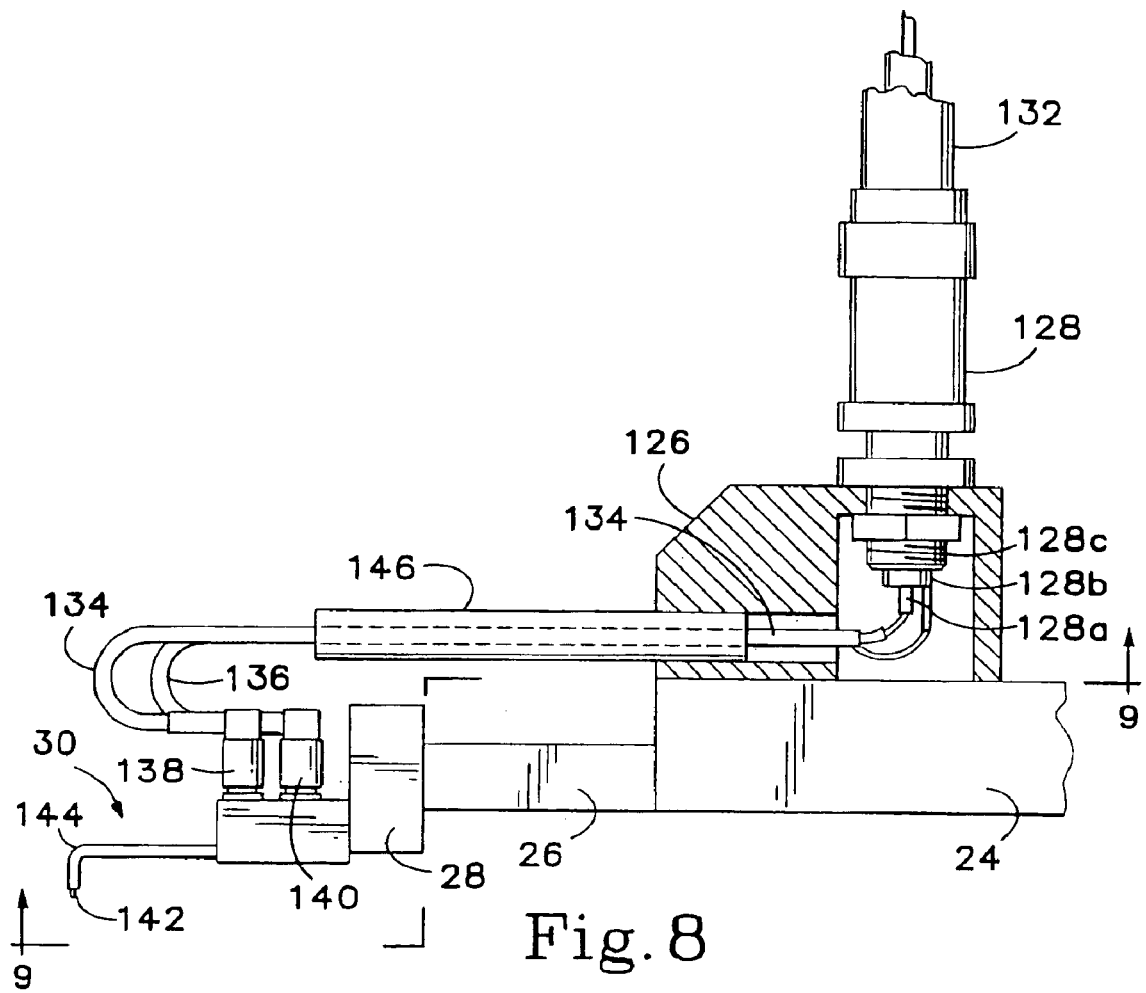
FIG. 8 is a partially sectional side view of a probe holder and probe.
Figure 9:
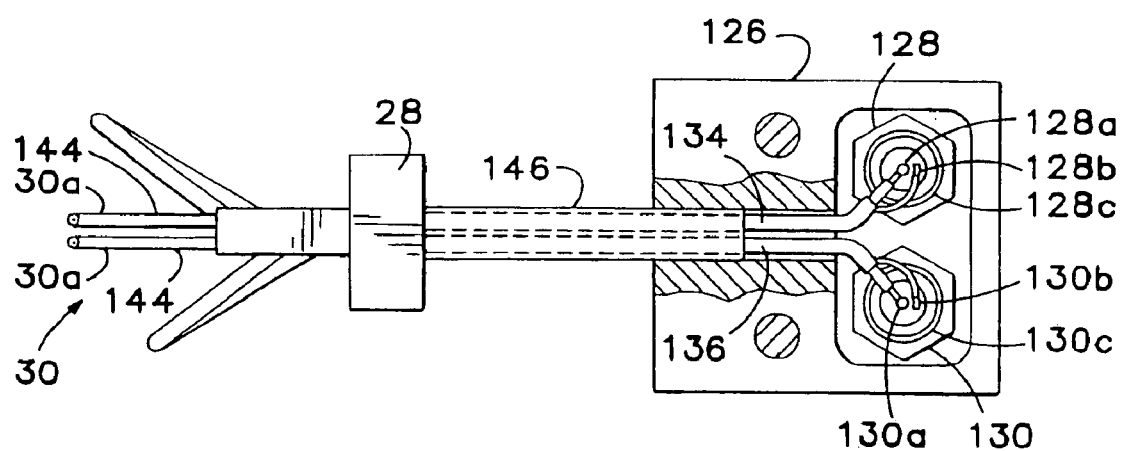
FIG. 9 is a partially sectional bottom view taken along line 9—9 of FIG. 8.

With reference to FIGS. 5B, 8 and 9, respective individually movable probes 30 comprising pairs of probe elements 30a are supported by respective probe holders 28 which in turn are supported by respective extending portions 26 of different probe positioners such as 24. Atop each probe positioner 24 is a shield box 126 having a pair of triaxial connectors 128, 130 mounted thereon with respective triaxial cables 132 entering each triaxial connector from a suitable test instrument as mentioned previously. Each triaxial connector includes a respective inner connector element 128a, 130a, an intermediate connector element 128b, 130b, and an outer connector element 128c, 130c in concentric arrangement. Each outer connector element 128c, 130c terminates by connection with the shield box 126. Conversely, the inner connector elements 128a, 130a, and the intermediate connector elements 128b, 130b, are connected respectively to the inner and outer conductors of a pair of coaxial cables 134, 136 which therefore are guarded cables. Each cable 134, 136 terminates through a respective coaxial connector 138, 140 with a respective probe element 30a having a center conductor 142 surrounded by a guard 144. In order to provide adequate shielding for the coaxial cables 134, 136, especially in the region outside of the octagonal box 48, an electrically-conductive shield tube 146 is provided around the cables 134, 136 and electrically connected through the shield box 126 with the outer connector element 128c, 130c of the respective triaxial connectors 128, 130. The shield tube 146 passes through the same slit in the foam 50 as does the underlying extending member 26 of the probe positioner 24. Thus, each individually movable probe 30 has not only its own separate individually movable probe holder 28 but also its own individually movable shield 146 for its guarded coaxial cables, which shield is movable in unison with the probe holder independently of the movement of any other probe holder by any other positioning mechanism 24. This feature is particularly advantageous because such individually movable probes are normally not equipped for both shielded and guarded connections, which deficiency is solved by the described structure. Accordingly, the probes 30 are capable of being used with the same guarding and Kelvin connection techniques in a ready-to-use manner as is the chuck assembly 20, consistently with full shielding despite the individual positioning capability of each probe 30.

Preferred Alternative Embodiment of the Probe Station

Figure 10:
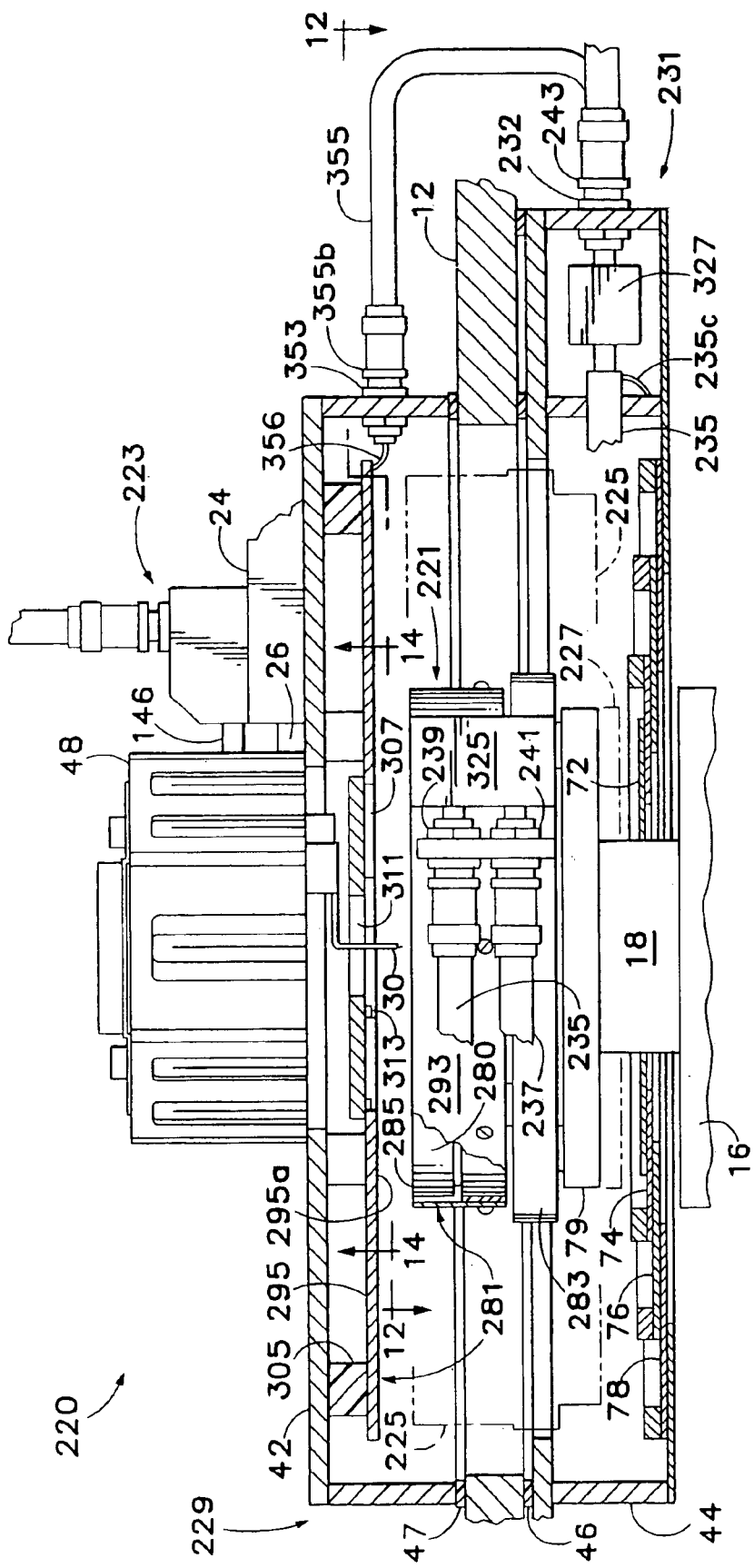
FIG. 10 is a partially sectional front view of an alternative exemplary embodiment of a wafer probe station constructed in accordance with the present invention.

FIG. 10 depicts a preferred alternative embodiment 220 of the wafer probe station which, like the basic embodiment depicted in FIG. 3, has the capability for providing guarded and Kelvin connections to the device under test but which also has additional features for facilitating extremely sensitive low-level current measurements. In particular, the alternative embodiment 220 includes a fully guarded movable chuck assembly 221 and a fully guarded probe-holding assembly 223. These features are described below in further detail each under a separate subheading.

In the respective drawings of the alternative probe station 220 and the basic probe station, like reference numerals have been used to identify elements that are common to both systems. Thus, comparing FIGS. 3 and 10, it will be evident that the fully guarded movable chuck assembly 221 is carried on a rectangular plunger 18 for movement along X, Y and Z axes under the control of a motorized positioner 16. As indicated by dashed lines in FIG. 10, the movable chuck assembly 221 has predetermined outer limits of horizontal movement 225 which, as previously described, are the result of interfering interaction between the upstanding margins which are on the bottom sealing plates 72, 74, 76, and 78.

FIG. 10 also shows a dashed line 227 signifying Z-axis or vertical movement of the chuck assembly 221. The expansibility of resilient gasket 46 together with the limited vertical adjustability of the platen 12 provide a further mechanism, in addition to that of the motorized positioner, for shifting the chuck assembly 221 vertically relative to the upper half 42 of the environment control enclosure box. For the sake of convenience, the upper and lower halves 42 and 44 of the control enclosure will hereafter be collectively referred to as the outer shielding enclosure 229 to emphasize their importance in providing shielding for the chuck assembly against outside electromagnetic interference. At the same time, however, it will be recognized that the outer enclosure has several other significant functions including gas containment, light shielding and temperature control.

In certain respects, the connector mechanism 231 of the alternative probe station 220 resembles that of the basic probe station. For example, in order to enable low-voltage measurements to be made in relation to the chuck assembly 221, the connector mechanism 231 includes both a source line and a measurement line to provide Kelvin-type connections to the chuck assembly. In particular, referring also to FIG. 12, the source and measurement lines each include an exterior connector 232 and 233, a flexible connector assembly 235 and 237, and an interior connector 239 or 241, respectively. For purposes of low-level current measurement, either of these lines can be used, and thus the broader term signal line, as used hereinbelow, will be understood to refer to a line that is of either type.

In relation to the chuck assembly 221, the exterior connectors 232 and 233 are mounted, as previously, on a vertical wall of the outer shielding enclosure 229 where they are accessible for detachable connection to an external signal line (e.g., 243 or 245) which is connected, in turn, to an external test instrument (not shown). The interior connectors 239 and 241 are mounted adjacent the chuck assembly 221. Preferably, the flexible connector assemblies 235 and 237 each include an end connecting member by which such assembly is fastened detachably to its corresponding interior connector so that fuller access to the sides of the chuck assembly can be obtained, as needed, in order to facilitate replacement of particular chuck assembly elements. Each connector assembly 235 and 237 is flexible in order to accommodate relative movement between the chuck assembly 221 and the outer shielding enclosure 229.

Preferably, the exterior connectors 232 and 233, the connector assemblies 235 and 237 and the interior connectors 239 and 241 are each of triaxial configuration, that is, each includes a center (signal) conductor surrounded by an intermediate (guard) conductor which, in turn, is surrounded by an outer (shield) conductor. These elements, alternatively, can be of coaxial configuration if individual line shielding is not employed. The connector mechanism 231 as it relates to the chuck assembly 221 is further described under the subheading immediately below and, in particular, it is therein described how such mechanism differs from that of the basic probe station due to its fully guarded construction. That portion 231a of the connector mechanism relating to the probe-holding assembly 223 is described below under the separate subheading pertaining thereto.

Fully Guarded Chuck Assembly and Connector Mechanism

Figure 11:
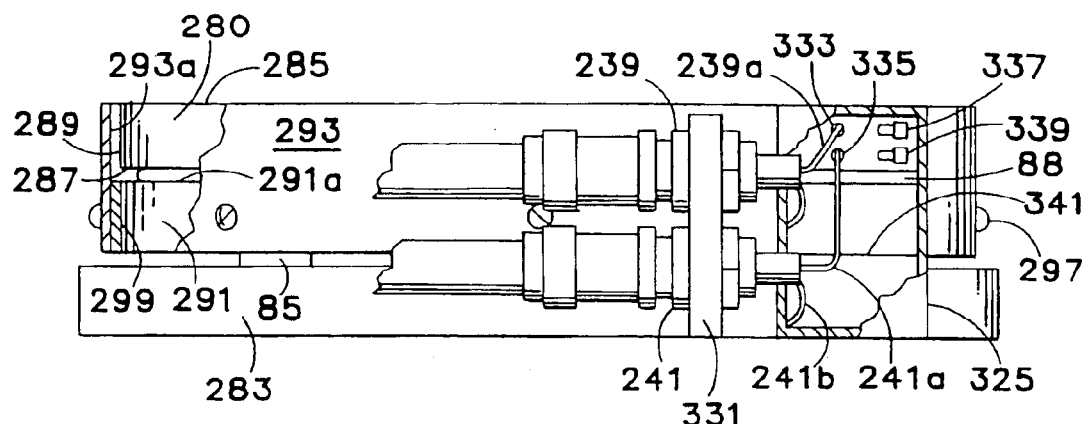
FIG. 11 is a front detail view showing the lower elements of the chuck assembly of the wafer probe station of FIG. 10 with hidden portions shown in cut-away view.

Referring to FIG. 10, as in the basic probe station, the chuck assembly 221 of the alternative probe station 220 includes a first or upper chuck assembly element 280, a second or lower chuck assembly element 281 and a third chuck assembly element 283 which detachably mounts the first two elements. Referring also to FIG. 11, as in the basic system, the respective chuck assembly elements are electrically isolated from each other including by dielectric spacers 85 and O-rings 88, and the first chuck assembly element has an upper surface 285 for horizontally supporting a test device, a lower surface 287 opposite the upper surface and a peripheral surface 289 vertically interconnecting the upper and lower surfaces.

However, in the alternative probe station 220, the construction of the second chuck assembly element 281 is different than that previously described in certain important respects. In particular, in addition to having a lower component 291, the second chuck assembly element further includes a skirting component 293 and an upper component 295. These components, as explained in greater detail below, are electrically connected with each other and are arranged relative to each other so as to surround the first chuck assembly element 280 on all sides. More specifically, a surface portion 291a included on the lower component extends opposite the entire portion of the lower surface 287 on the first chuck assembly element, a surface portion 293a included on the skirting component extends opposite the entire portion of the peripheral surface 289 on the first chuck assembly element and a surface portion 295a included on the upper component extends opposite the entire portion of the upper surface 285 on the first chuck assembly element. Moreover, these relationships are maintained even when the chuck assembly 221 is brought to its predetermined outer limits of horizontal movement 225. Thus, the surface portion 295a on the upper component is maintained opposite the entire portion of the upper surface 285 on the first chuck assembly element despite relative movement occurring therebetween.

Viewing this arrangement somewhat differently, it will be recognized that relative to any location on the respective surfaces 285, 287 and 289 of the first chuck assembly element 280, the second chuck assembly element 281 is considerably closer to such location than is the outer shielding enclosure 229 even along those angles of approach which do not lie perpendicular to such surfaces. Accordingly, electromagnetic interaction between the first chuck assembly element and its neighboring environment is only able to occur in relation to the second chuck assembly element. However, as fully described below, the connector mechanism 231 is so constructed as to enable the voltage potential on the second chuck assembly element to follow the potential which is on the first chuck assembly element. In accordance with this relationship, then, the first chuck assembly element is effectively isolated electrically from its neighboring environment.

Figure 12:
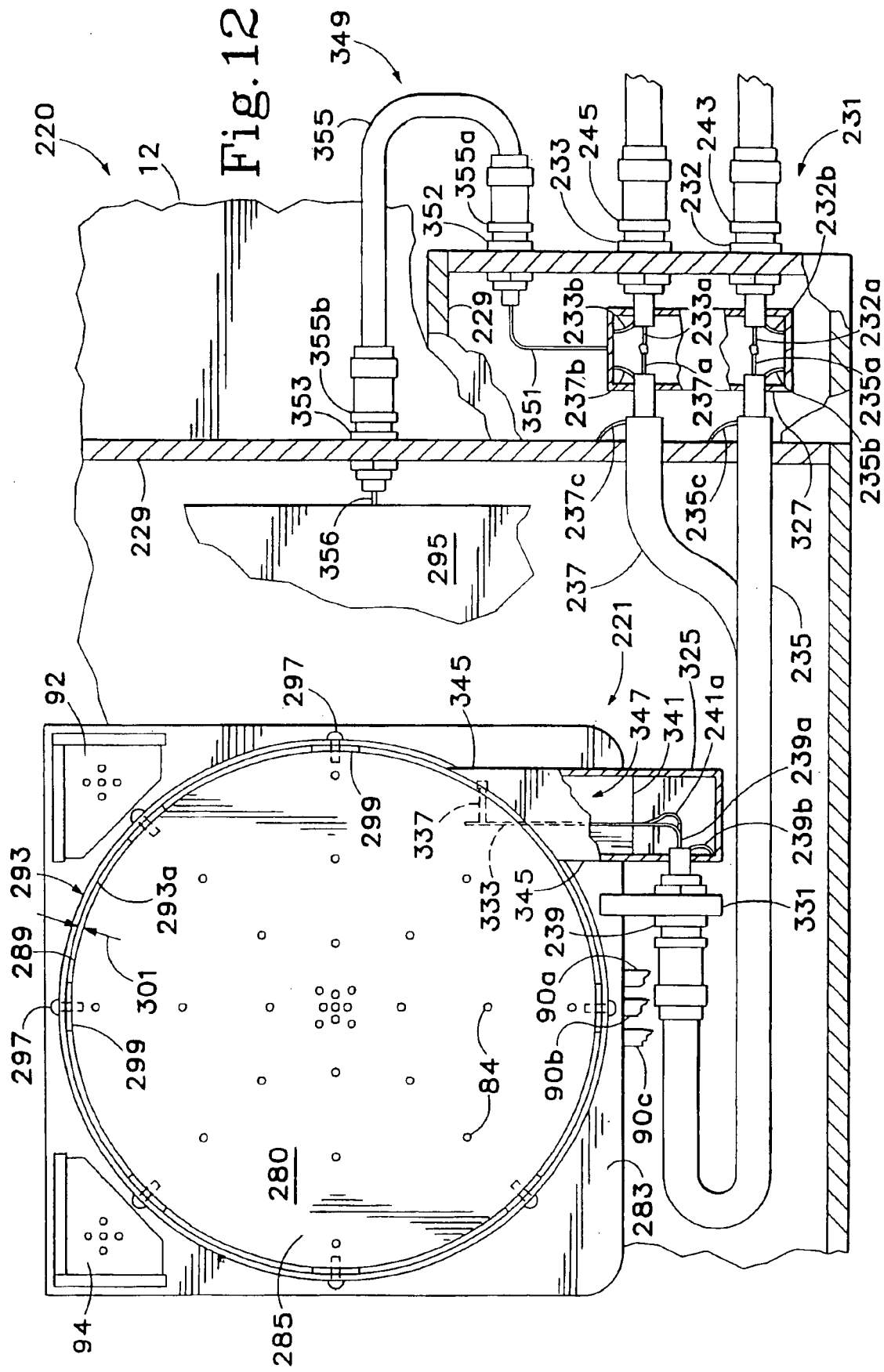
FIG. 12 is a partial top detail view showing the connector mechanism and the lower elements of the chuck assembly as viewed along line 12—12 of FIG. 10.

In the preferred alternative probe station 220 depicted in FIGS. 10–12, the skirting component 293 is formed from a closed-sided strip of conductive material such as tin-plated steel. The strip is connected both mechanically and electrically to the lower component 291 by a plurality of threaded steel bolts 297. Metal washers 299 which are seated on the bolts maintain the skirting component 293 in radially spaced-apart surrounding relationship to the first chuck assembly element 280. In this manner, the surface portion 293a of the skirting component and the peripheral surface 289 of the first chuck assembly element are separated from each other by an open gap 301 so that the capacitance between these respective surfaces is minimized.

Referring to FIG. 10, the upper component 295 of the preferred alternative probe station 220 is formed from a sheet of conductive material such as tin-plated steel. The upper side of the sheet is attached to the top of the outer shielding enclosure 229 by several strips of insulative foam tape having double-sided adhesive as of a type sold commercially, for example, by the 3M Company based in St. Paul, Minn. In this manner, the upper component 295 is held in spaced relationship above the skirting component 293 so that each is separated from the other by an open gap.

The above form of construction is preferred over one in which no gap is provided between the skirting component 293 and the upper component 295 as may be achieved, for example, by fitting a resilient conductive gasket to the skirting component in such a manner that the gasket bridges the gap between the respective components. In this alternative but less desired form of construction, it is difficult to completely avoid abrasion of the upper component because the gasket or other bridging element will rub across the upper component when that component shifts horizontally relative to the outer shielding enclosure 227. In this alternative construction, then, it is possible for small filings or other debris to be swept from the abraded surface of the upper component 295 into the central testing area causing possible damage to the device under test. In the preferred form of construction, on the other hand, the possibility of such damage has been avoided.

Figure 14:
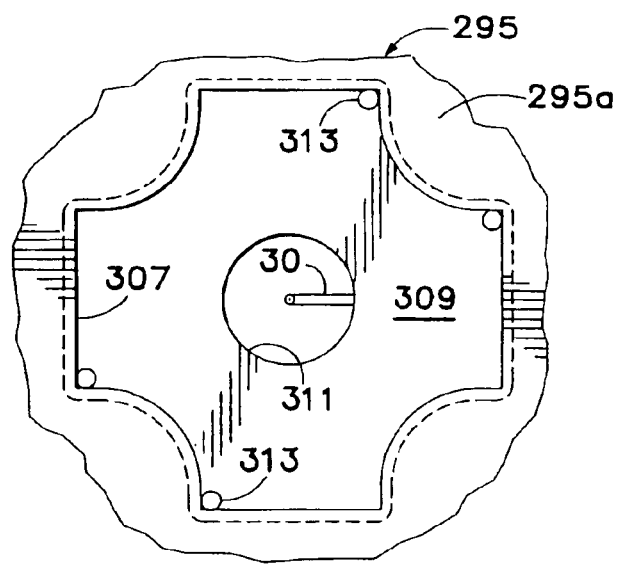
FIG. 14 is a bottom view of an optional conductive panel in position on the upper guard component as viewed along line 14–14 in FIG. 10.

Centrally formed in the conductive sheet comprising the upper component 295 is a probing aperture 307. As indicated in FIG. 10, the extreme end of each individual probe 30 can be inserted through this probing aperture in order to make contact with a wafer supported for test on the first chuck assembly element 280. Referring also to FIG. 14, which shows the view looking toward the surface portion 295a of the upper component, the probing aperture 307 has an irregular diameter, that is, it is of a cross-like shape. As an option, a conductive panel 309 is preferably provided that selectively fits detachably over the probing aperture and that includes a central opening 311, smaller in size than the probing aperture 307, through which the extreme end of the electrical probe can be inserted, as shown. Because of its relatively smaller opening, the conductive panel 309 tends to reduce somewhat the range of horizontal movement of each electrical probe but, correspondingly, tends to increase the degree of electromagnetic isolation between the first chuck assembly element 280 and the outer shielding enclosure 229 since it extends the effective surface area of the surface portion 295a of the upper component. Hence, the conductive panel is particularly suited for use in those applications in which extremely sensitive current measurements are needed. Referring again to FIG. 14, the exemplary conductive panel 309 has a cross-like shape so that it covers the probing aperture 307 with only a small margin of overlap. Referring to FIGS. 10 and 14 together, conductive pegs 313 project outwardly from the underside of the conductive panel. These pegs, as shown, are arranged into opposing pairs so that each pair can be wedged snugly between opposite corners of the probing aperture, thus preventing rotation of the conductive panel in its seated position on the upper component.

Figure 13:
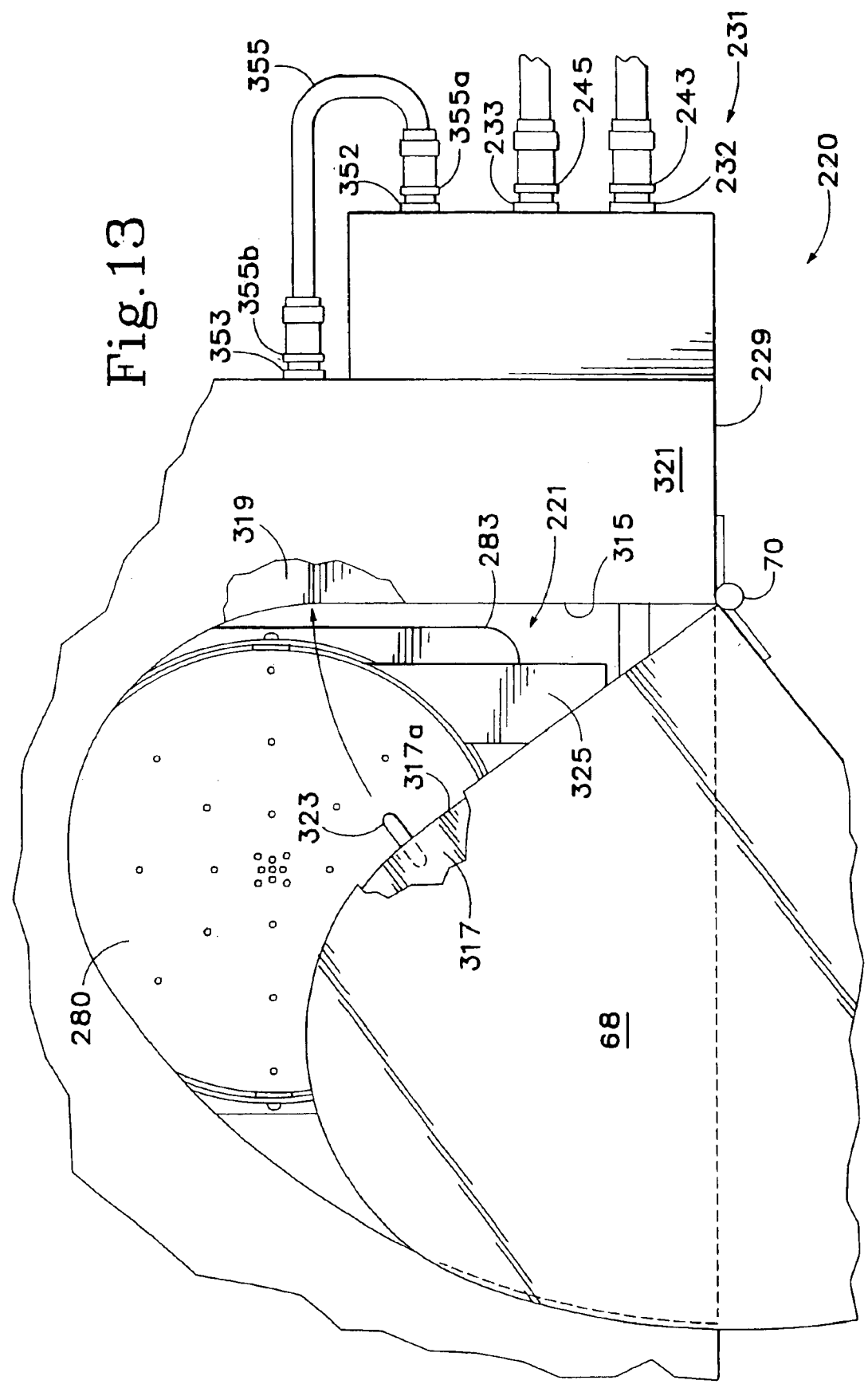
FIG. 13 is a partial top view of the wafer probe station of FIG. 10 with the outer enclosure door shown partially open.

Referring to FIG. 13, the outer shielding enclosure 229 includes a loading aperture 315 through which access to the chuck assembly 221 is obtained and a hinged door 68 for opening and closing the loading aperture. Along this portion of the outer shielding enclosure, the upper component 295 is divided into respective first and second sections 317 and 319. The first section 317 is mounted inside the door for movement with the door as the door is being opened, and the second section 319 is mounted behind the surrounding portion 321 of the outer shielding enclosure. As previously described, insulated foam tape having double-sided adhesive is used to mount these sections so that each is electrically isolated from its respective mounting surface. As shown in FIG. 13, the outer edge 317a of the first section is slightly offset inwardly from the edge of the door 68 so that when the door is moved to its closed position in slight marginal overlap with the surrounding portion 321, this brings the two sections 317 and 319 into physical contact with each other along an extended portion of their respective outer edges. To further ensure that there is good electrical contact between the first and second sections of the upper component, a conductive tab 323 is soldered to the underside or surface portion 295a of the first section so that when the door is closed such tab can establish oxide-removing wiping electrical contact with the underside or surface portion 295a of the second section.

In the preferred probe station 220, not only is the chuck assembly 221 fully guarded but so too is the connector mechanism 231. In particular, referring to FIGS. 10 and 12, the signal lines of the connector mechanism 231 by which the chuck assembly is energized are fully guarded by a first box-like inner guard enclosure 325 and a second box-like inner guard enclosure 327. As is explained under the next subheading below, there is also a third box-like inner guard enclosure 329 (refer to FIG. 15) to provide guarding for that portion 231a of the connector mechanism associated with each probe-holding assembly 223.

With respect to the ground connections established via the connector mechanism 231, the outer conductor of each exterior connector 232 and 233 is electrically connected through the outer shell of such connector to the outer shielding enclosure 229. Respective grounding straps 235c and 237c electrically interconnect the outer conductor of each connector assembly 235 and 237, respectively, to the outer shielding enclosure. The outer conductor of each interior connector 239 and 241 is connected electrically through the outer shell of such connector to the third chuck assembly element 283 via a metal flange 331 that projects outwardly from the side of the third chuck assembly element. Accordingly, if detachable connection is made between either connector assembly 235 or 237 and the corresponding interior connector 239 or 241, the third chuck assembly element 283 and the outer shielding enclosure 229 are then tied to the same potential, that is, to the ground potential of the system as maintained at either exterior connector 232 or 233 via the outer conductor of the external signal line (e.g., 243 or 245).

The inner and intermediate conductors of the interior connector 239 are separated out from their respective insulating members so as to form a signal (source) line element and a guard line element 239a and 239b, respectively. In relation to an inner or intermediate conductor, the term "line element" as used herein and in the claims is intended to refer to such conductor along any portion thereof where it is arranged exterior of its outside conductor(s), even if at some portion further back from its end the inner or intermediate conductor is surrounded by the outside conductor(s).

Referring also to FIG. 11, in similar manner, the inner and intermediate conductors of the interior connector 241 are separated out from their respective insulating members so as to form a signal (measurement) line element and a guard line element 241a and 241b, respectively. The respective signal line elements 239a and 241a are electrically tied together at the first chuck assembly element 280 thereby establishing a Kelvin connection with respect thereto. In particular, these signal line elements are inserted into respective holes 333 and 335 which are formed in the peripheral edge of the first chuck assembly element 280 where they are held detachably in place each by a respective set screw 337 or 339 that is adjusted by means of turning to its respective clamping position.

In order to provide full guarding in relation to each of the respective signal line elements 239a and 241a, a first box-like inner guard enclosure 325 is provided which is so arranged that it surrounds these elements in interposed relationship between them and the outer shielding enclosure 229. In the preferred embodiment depicted, tin-plated steel panels are used to construct the first guard enclosure. In order to enable the leakage current flowing from either of the signal line elements 239a or 241a to be reduced to a negligible level, each of the guard line elements 239b and 241b is electrically connected, as by soldering, to the enclosure 325, preferably on an inside wall thereof. Accordingly, by appropriate adjustment of the guard potential as carried by either guard line element 239b or 241b, the potential on the guard enclosure can be controlled so as to substantially follow the signal potential which is carried either by the signal (source) line element 239a or by the signal (measurement) line element 241a. Since leakage current from either signal line element 239a or 241a can thus be reduced to virtually zero, the measurement of very low-level currents can be made via either element. Moreover, to the extent that field disturbances occur in the region surrounding the first guard enclosure, such disturbances will be resolved at the first guard enclosure without affecting the stability at the signal as carried by either signal line element.

As indicated in FIGS. 11 and 12, the first guard enclosure 325 has a step 341 in its floor panel so that no part of the enclosure comes into either physical or electrical contact with the third chuck assembly element 83. The first guard enclosure is electrically connected at its inside edges 345 to the skirting component 293, as by soldering. Hence the guard potential as carried by either of the guard line elements 239b or 241b is conveyed to the lower and skirting components of the second chuck assembly element 281 via the first guard enclosure 325, thereby enabling these components to provide guarding in relation to the first chuck assembly element 280. The enclosure further forms a passage 347 that opens towards the first chuck assembly element 280. In this manner, the respective signal line elements 239a and 241a are completely enclosed for full guarding by the first guard enclosure 325 as they extend through this passage for parallel electrical connection with the first chuck assembly element.

As previously mentioned, the various components of the second chuck assembly element 281 are electrically connected to each other, that is, the upper component 295 is electrically connected to the skirting component 293 as well as to the lower component 291. In order to obtain this connection to the upper component, a coupling assembly 349 is provided. This coupling assembly is so constructed that the guard potential as carried by the intermediate (guard) conductor of either exterior connector 232 or 233 can be conveyed to the upper component via such coupling assembly in addition, for example, to being conveyed to the lower and skirting components via either of the guard line elements 239b or 241b.

Referring to FIG. 10, the coupling assembly 379 preferably acquires the guard potential at a fixed connection point located adjacent the exterior connectors 232 and 233. In preparation for this connection, the inner and intermediate conductors of the exterior connector 232 are separated out from their respective insulating members so as to form a signal (source) line element and a guard line element 232a and 232b, respectively. Similarly, the inner and intermediate conductors of the exterior connector 233 are separated out so as to form a signal (measurement) line element and a guard line element 233a and 233b, respectively. Opposite the exterior connector 232, the inner and intermediate conductors of the connector assembly 235 are separated out to form a signal (source) line element and a guard line element 235a and 235b, respectively, while opposite the exterior connector 233 the inner and intermediate conductor of the connector assembly 237 are separated out to form a signal (measurement) line element and a guard line element 237a and 237b, respectively. As shown, the corresponding pairs of signal line elements are directly connected electrically by, for example, soldering signal line element 232a to 235a (to join the source line) and signal line element 233a to 237a (to join the measurement line).

In order to provide full guarding in relation to each of the corresponding pairs of signal line elements 232a and 235a or 233a and 237a, a second box-like inner guard enclosure 327 is provided which is so arranged that it surrounds these elements in interposed relationship between them and the outer shielding enclosure 229. In the preferred embodiment depicted, tin-plated steel panels are used to construct the second guard enclosure. In order to enable the leakage current flowing from either of these pairs of signal line elements to be reduced to a negligible level, each of the guard line elements 232b, 233b, 235b and 237b is electrically connected, as by soldering, to the second guard enclosure 327, preferably on an inside wall thereof. Hence, by appropriate adjustment of the guard potential as carried by either guard line element 232b or 233b, the potential on the guard enclosure can be controlled so as to substantially follow the signal potential that is carried either by the pair of signal line elements 232a and 235a or by the pair of signal line elements 233a and 237a. Since leakage current from either of the corresponding pairs of signal line elements 232a and 235a or 233a and 237a can thus be reduced to virtually zero, the measurement of very low-level currents can be made via either pair. Moreover, any field disturbances in the region surrounding the second guard enclosure will be resolved at such enclosure without affecting the stability of the signal as carried by either pair.

Referring to FIGS. 10 and 12 together, the coupling assembly 349 includes a lower guard line element 351, a pair of pass-through connectors 352 and 353, a flexible connector assembly or cable 355, and an upper guard line element 356. To enable the coupling assembly to acquire the guard potential, one end of the lower guard line element 351 is electrically connected to the second guard enclosure 327, as by soldering. Preferably, the pass-through connectors and the connector assembly are of coaxial configuration so that the center conductor of each is able to convey the guard potential from the lower guard line element to the upper guard line element. The upper guard line element 356 and the upper component 295, in turn, are connected together electrically, as by soldering, so that the guard potential is conveyed to the upper component via the upper guard line element.

In an alternative construction, it is possible to run the lower guard line element 351 directly between the second guard enclosure 327 and the upper component 295. However, such a construction would make it difficult to separate the upper and lower halves 42 and 44 of the outer shielding enclosure 229 should the operator wish to gain access to elements within the enclosure. In order to provide such access, in the preferred coupling assembly 349 shown, the connector assembly 355 has end connecting members 355a and 355b that connect detachably to each pass-through connector. Thus, upon detachment of either end connecting member, the two halves 42 and 44 of the outer shielding enclosure can be separated from each other to gain access to the interior of the enclosure.

In accordance with a preferred method of using the fully guarded chuck assembly 221, test equipment suitable for guarded measurement of low-level currents is connected with a selected one of the exterior connectors 232 or 233 via an external line (e.g., 243 or 245). The first chuck assembly element 280 is then energized, that is, a current signal is established through a signal path which includes the probe 30, the device-under-test (not shown), and that series of signal line elements 232a, 235a and 239a, or 233a, 237a and 241a which corresponds to the chosen connector 232 or 233. A nonzero signal potential is thus developed on the first chuck assembly element 280 in relation to system ground, that is, in relation to the potential on the outer shielding enclosure 229. As this occurs, a guard potential substantially equal to the signal potential is simultaneously conveyed to the upper component 295 via guard line elements 351 and 356 and to the lower and skirting components 291 and 293 via that series of guard line elements 232b, 235b and 239b or 233b, 237b and 241b which corresponds to the chosen connector. This guard potential is initially generated inside the test equipment by a feedback network of a design known to those of ordinary skill in the art. In accordance, then, with the foregoing procedure, the first chuck assembly element 280 is electrically guarded by the second chuck assembly element 281.

Since, in accordance with the above method, almost no potential difference is developed between the first chuck assembly element 280 and the neighboring second chuck assembly element 281, and since the geometry of the second chuck assembly element is such that it fully surrounds the first chuck assembly element, leakage current from the first chuck assembly element is reduced to negligible levels. A further reduction in leakage current is achieved by the first and second inner guard enclosures 325 and 327 which, being held at nearly the same potential as the signal line elements they respectively surround, reduce leakage currents from those elements. As a result, system sensitivity to low-level current is increased because the level of current that is allowed to escape detection by being diverted from the signal path is negligible.

In addition to increased current sensitivity, another major benefit of the fully guarded chuck assembly 221 is its capability for reducing settling time during low-level current measurements. During such measurements, the rate of charge transfer in relation to the first chuck assembly element 280 is limited by the amount of current that can flow through the device under test given the bias conditions imposed on that device, whereas the rate of charge transfer in relation to the second chuck assembly element 281 is under no such restriction. Accordingly, the second chuck assembly element 281 and also the first and second guard enclosures 325 and 327 are able to transfer sufficient charge so that each achieves its full potential relatively quickly, even though each is capacitively coupled to surrounding conductive surfaces of relatively large area such as those on the interior of the outer shielding enclosure 229. Finally, in relation to the first chuck assembly element 280 and also to the signal line elements in the connector mechanism 231, the second chuck assembly element 281 and each of the guard enclosures 325 and 327 act as barriers against stray electromagnetic radiation, thereby increasing signal stability.

The benefits provided by the fully guarded chuck assembly 221 in regard to low-level current measurements are achieved while, at the same time, preserving the capacity of the system for making low-level voltage measurements. As previously described, the connector mechanism 231 continues to provide separate source and measurement lines suitable for the establishment of Kelvin-type connections. Moreover, the first chuck assembly element 280 is movable relatively freely relative to each individual probe 30 without being encumbered by any of the elements that provide guarding. In particular, electrical connection is maintained between the upper component 295 and the skirting component 293 via the coupling assembly 349 despite horizontal or vertical movement occurring between these components. With respect to the first inner guard enclosure 325 and the second inner guard enclosure 327, either vertical or horizontal movement is accommodated between these enclosures because of flexibility in the connector assemblies 239 and 241.

Probe-holding Assembly with Fully Guarded Connector Mechanism

The alternative probe station 220 preferably includes at least one fully guarded probe-holding assembly 223. Referring to FIGS. 15 and 16, it will be recognized that from the standpoint of overall construction, each fully guarded probe-holding assembly 223 is generally similar to the probe-holding assembly of the basic probe station as depicted in FIGS. 8–9. As between FIGS. 15–16 and FIGS. 8–9, like reference numerals have been used to identify elements common to both systems. It will be seen, in particular, that the portion 231a of the connector mechanism associated with the probe-holding assembly 223 preferably includes a pair of connectors 128 and 130 of triaxial configuration, each of which are mounted on an outer shielding enclosure or box 126. These exterior connectors, then, are suitably configured to receive the respective source and measurement line cables 132 which arrive from the external test instrument (not shown) as needed to establish Kelvin-type connections in relation to the probe 30.

The inner and intermediate conductors of the exterior connector 128 are separated out from their respective insulating members so as to form a signal (source) line element and a guard line element 128a and 128b, respectively. Similarly, the inner and intermediate conductors of the exterior connector 130 are separated out from their respective insulating members so as to form a signal (measurement) line element and a guard line element 130a and 130b, respectively. As in the basic system shown in FIGS. 8 and 9, each of the signal line elements 128a and 130a is electrically connected with the center conductor 142 of a respective probe element 30a via the center conductor of a corresponding coaxial connector 138 or 140 and the center conductor of a corresponding coaxial cable 134 or 136. To provide a guarding capability in relation to each signal path, each guard line element 128b or 130b is electrically connected with the guard conductor 144 of its corresponding probe element 30a via the outside conductor of the corresponding coaxial connector 138 or 140 and the outside conductor of the corresponding coaxial cable 134 or 136. Each exterior connector 128 or 130 further includes an outer shield element 128c or 130c both of which are electrically connected with the outer shielding box 126. This box, in turn, is electrically connected with the shield tube 146, so that when the shield tube is inserted into the octagonal steel box 48, as previously described, the signal and guard lines will be fully shielded.

In order to provide full guarding in relation to each of the respective signal line elements 128a and 130a of the fully guarded probe-holding assembly 223, the alternative probe station 220 includes a third box-like inner guard enclosure 329. This guard enclosure is so arranged that it surrounds the respective signal line elements 128a and 130a in interposed relationship between them and the outer shielding enclosure or box 126. In the preferred embodiment depicted in FIGS. 15 and 16, the third guard enclosure is constructed from tin-plated steel panels. The respective guard line elements 128b and 130b are both electrically connected, as by a respective wire 148, to the enclosure 329, preferably on an inside wall thereof.

During the measurement of low-level currents through the probe 30, as previously described, the interconnections made between the connector mechanism portion 231a and the third guard enclosure 329 enable the potential on the guard enclosure 329 to be controlled so that such potential substantially follows the signal potential as carried by either signal line element 128a or 130a. In particular, the potential on the third guard enclosure is controlled either by adjustment of the guard potential on guard line element 128b or 130b.

Since, in accordance with the above construction, the third guard enclosure 329 fully surrounds each signal line element 128a or 130a and will carry substantially the same potential as these elements, leakage current from either signal line element is reduced to virtually zero so that very low-level currents can be measured via either element. Moreover, any field disturbances in the region surrounding the third guard enclosure will be resolved at that enclosure without affecting the stability of the signal as carried by either signal line element.

Although a preferred alternative embodiment 220 of the probe station has been described, it will be recognized that alternative forms of the embodiment are possible within the broader principles of the present invention. Thus, with respect to the fully guarded chuck assembly 221, instead of having a closed-sided structure, either the skirting component 293 or the upper component 295 may have a mesh, open-slat or multilevel structure. Also, it is possible to position a dielectric sheet between the first chuck assembly element 280 and the skirting component 293 in order to form a sandwich-type structure. In yet a further possible modification, the first inner guard enclosure 325 can be integrated with the skirting component 293 so that, for example, the skirting component includes U-shaped side portions which serve as the first guard enclosure. Moreover, instead of having a box-like form, each guard enclosure can take the form of a cylinder or various other shapes.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A probe station comprising:
   (a) a chuck assembly for supporting a test device;
   (b) a probe support for supporting a probe;
   (c) a positioning mechanism enabling at least one of said probe support and said chuck assembly to move relative to the other;
   (d) said chuck assembly including at least two electrically conductive chuck assembly elements with a gap separating said elements from each other, at least a major volume of said gap being filled with air; and
   (e) said probe station including an electrically-conductive enclosure at least partially enclosing said chuck assembly, said elements being separated by respective electrical insulation members from each other and from said conductive enclosure.

2. A probe station comprising:
   (a) a chuck assembly for supporting a test device;
   (b) a probe support for supporting a probe;
   (c) a positioning mechanism enabling at least one of said probe support and said chuck assembly to move relative to the other;
   (d) said chuck assembly including at least two electrically conductive chuck assembly elements with a gap separating said elements from each other, at least a major volume of said gap being filled with air; and
   (e) said probe station including an electrically-conductive enclosure at least partially enclosing said chuck assembly, said elements being electrically insulated from each other and from said conductive enclosure.

3. A probe station comprising:
   (a) a chuck assembly for supporting a test device;
   (b) a probe support for supporting a probe;
   (c) a positioning mechanism enabling at least one of said probe support and said chuck assembly to move relative to the other;

(d) said chuck assembly including at least two electrically conductive chuck assembly elements, at least one of said elements including an electrically conductive member extending toward the other of said elements in spaced-apart relationship thereto;

(e) said probe station including an electrically conductive environment control enclosure mounted thereon having a wall portion in spaced-apart relationship to said other of said elements with said electrically conductive member located therebetween, and defining a controlled-environment region in communication with a surface area on said other of said elements, said elements being separated by respective electrical insulation members from each other and from said conductive enclosure; and (f) said chuck assembly being movable relative to said wall portion of said enclosure while a constant spacing is maintained between said electrically conductive member and said other of said elements.

4. A probe station comprising:

(a) a chuck assembly for supporting a test device;

(b) a probe support for supporting a probe;

(c) a positioning mechanism enabling at least one of said probe support and said chuck assembly to move relative to the other;

(d) said chuck assembly including an electrically-conductive chuck assembly element having a laterally-extending surface for supporting said test device;

(e) an electrically-conductive component extending laterally in spaced-apart relationship to said surface, at least one of said chuck assembly element and said conductive component being movable laterally with respect to the other, said conductive component defining at least one hole through which said probe can extend transversely with respect to said conductive component so that an electrical connection can be made with said test device by said probe at different lateral relationships between said chuck assembly element and said conductive component, said probe station including an electrically conductive enclosure at least partially enclosing said chuck assembly and said conductive component, said chuck assembly element and said conductive component being separated by respective electrical insulation members from said conductive enclosure.

5. The probe station of claim 4 wherein said conductive component has a more extensive lateral area than does said surface.

6. A probe station comprising:

(a) a chuck assembly for supporting a test device;

(b) a probe support for supporting a probe;

(c) a positioning mechanism enabling at least one of said probe support and said chuck assembly to move relative to the other;

(d) said chuck assembly including an electrically-conductive chuck assembly element having a laterally-extending surface for supporting said test device;

(e) an electrically-conductive component extending laterally in spaced-apart relationship to said surface, at least one of said chuck assembly element and said conductive component being movable laterally with respect to the other, said conductive component defining at least one hole through which said probe can extend transversely with respect to said conductive component so that an electrical connection can be made with said test device by said probe at different lateral relationships between said chuck assembly element and said conductive component, said probe station including an electrically conductive enclosure at least partially enclosing said chuck assembly and said conductive component, said conductive component being separated by at least one electrical insulation member from said conductive enclosure.

7. The probe station of claim 6 wherein said conductive component has a more extensive lateral area than does said surface.

8. A probe station comprising:

(a) a chuck assembly for supporting a test device;

(b) a laterally-extending probe support for supporting a probe;

(c) a positioning mechanism enabling at least one of said probe support and said chuck assembly to move relative to the other;

(d) said chuck assembly including an electrically-conductive chuck assembly element having a laterally-extending surface for supporting said test device;

(e) an electrically-conductive component extending laterally in spaced-apart relationship to said surface, at least one of said chuck assembly element and said conductive component being movable laterally with respect to the other, said conductive component and said probe support each defining at least one hole through which said probe can extend transversely with respect to said conductive component and said probe support so that an electrical connection can be made with said test device by said probe at different lateral relationships between said chuck assembly element and said conductive component, said conductive component having a more extensive lateral area than does said laterally-extending surface of said chuck assembly element and being separated by at least one electrical insulation member from said probe support.

* * * * *

UNITED STATES PATENT AND TRADEMARK OFFICE
CERTIFICATE OF CORRECTION

PATENT NO. : 6,980,012 B2 Page 1 of 1
APPLICATION NO. : 10/678549
DATED : December 27, 2005
INVENTOR(S) : Schwindt et al.

It is certified that error appears in the above-identified patent and that said Letters Patent is hereby corrected as shown below:

Column 1, line 48 - change "pages 2-1" to --pages 1-2--
Column 4, line 29 - change "strav radiation" to --stray radiation--

Signed and Sealed this

Eighteenth Day of March, 2008

JON W. DUDAS
*Director of the United States Patent and Trademark Office*

Disclaimer

6,980,012—Randy J. Schwindt, Portland, OR (US); Warren K. Harwood, Vancouver, WA (US); Paul A. Tervo, Vancouver, WA (US); Kenneth T. Smith, Portland, OR (US); Richard H. Warner, Portland, OR (US). WAFER PROBE STATION FOR LOW-CURRENT MEASUREMENTS. Patent dated December 27, 2005. Disclaimer filed February 25, 2008, by the assignee, Cascase Microtech, Inc.

Hereby disclaims the following complete claims in the above identified patent 1-8.

*(Official Gazette September 30, 2008)*

UNITED STATES PATENT AND TRADEMARK OFFICE
CERTIFICATE OF CORRECTION

PATENT NO. : 6,980,012 B2 Page 1 of 1
APPLICATION NO. : 10/678549
DATED : December 27, 2005
INVENTOR(S) : Randy L. Scwindt et al.

It is certified that error appears in the above-identified patent and that said Letters Patent is hereby corrected as shown below:

On the title page, item [60]
Related U.S. Application Data
Change "Continuation of application No. 10/274,086, filed Oct. 18, 2002, now Pat. No. 6,740,036 which is a continuation of application No. 10/003,948, filed Oct. 30, 2001, now Pat. No. 6,492,822, which is a continuation of application No. 09/784,231, filed Feb. 13, 2001, now Pat. No. 6,335,628, which is a continuation of application No. 08/855,735, filed May 9, 1997, now Pat. No. 6,232,788, which is a continuation of application No. 08/508,324 filed Jul. 27, 1995, now Pat. No. 5,516,855 which is a continuation of application No. 08/100,494, filed Aug. 2, 1993, now Pat. No. 5,457,398, which is a continuation in part of application No. 07/896,853 filed Jun. 11, 1992, now Pat. No. 5,345,170, said application No. 08/508,324, is a continuation-in-part of application No. 08/417,982 filed on Apr. 6, 1995, now Pat. No. 5,532,609, which is a division of application No. 08/245,581 filed May 18, 1994, now Pat. No. 5,434,512, which is a division of application No. 07/896,853."

to --Continuation of application No. 10/274,068, filed Oct. 17, 2002, now Pat. No. 6,720,782, which is a continuation of application No. 10/003,948, filed Oct. 30, 2001, now Pat. No. 6,492,822, which is a continuation of application No. 09/784,231, filed on Feb. 13, 2001, now Pat. No. 6,335,628, which is a continuation of application No. 08/855,735, filed May 9, 1997, now Pat. No. 6,232,788, which is a continuation of application No. 08/508,325, filed Jul. 27, 1995, now Pat. No. 5,663,653, which is a continuation of application No. 08/100,494, filed Aug. 2, 1993, now Pat. No. 5,457,398, which is a continuation-in-part of application No. 07/896,853, filed Jun. 11, 1992, now Pat. No. 5,345,170, which is a continuation of application No. 10/274,068, filed Oct. 17, 2002, now U.S. Pat. No. 6,720,782, which is a continuation of application No. 10/003,948, filed Oct. 30, 2001, now Pat. No. 6,492,822, which is a continuation of application No. 09/784,231, filed on Feb. 13, 2001, now Pat. No. 6,335,628, which is a continuation of application No. 08/855,735, filed May 9, 1997, now Pat. No. 6,232,788, which is a continuation of application No. 08/508,325, filed Jul. 27, 1995, now Pat. No. 5,663,653, which is a continuation-in-part of application No. 08/417,982, filed Apr. 6, 1995, now Pat. No. 5,532,609, which is a division of application No. 08/245,581, filed May 18, 1994, now Pat. No. 5,434,512, which is a division of application No. 07/896,853, filed Jun. 11, 1992, now Pat. No. 5,345,170.--.

Signed and Sealed this

Twenty-ninth Day of June, 2010

David J. Kappos
*Director of the United States Patent and Trademark Office*